(12) United States Patent
Wellig

(10) Patent No.: US 12,261,448 B2
(45) Date of Patent: Mar. 25, 2025

(54) LOW POWER SENSOR WITH ENERGY HARVESTING

(71) Applicant: Honeywell International Inc., Charlotte, NC (US)

(72) Inventor: Armin Wellig, Mont-sur-Rolle (CH)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 345 days.

(21) Appl. No.: 17/834,509

(22) Filed: Jun. 7, 2022

(65) Prior Publication Data
US 2023/0393168 A1    Dec. 7, 2023

(51) Int. Cl.
*H02J 50/00* (2016.01)
*H02J 50/30* (2016.01)
(Continued)

(52) U.S. Cl.
CPC ............ *H02J 50/001* (2020.01); *H02J 50/00* (2016.02); *H02J 50/30* (2016.02); *G01P 1/02* (2013.01); *G01R 31/3842* (2019.01)

(58) Field of Classification Search
CPC ... G01P 1/00; G01P 1/02; G01P 13/00; G01K 1/08; G05B 19/00; G05B 19/048;
(Continued)

(56) References Cited

U.S. PATENT DOCUMENTS

| | | |
|---|---|---|
| 191,512 A | 6/1877 | Bennett et al. |
| 4,009,647 A | 3/1977 | Howorth |

(Continued)

FOREIGN PATENT DOCUMENTS

| | | |
|---|---|---|
| CA | 2387100 A1 | 11/2003 |
| CA | 2538139 A1 | 3/2005 |

(Continued)

OTHER PUBLICATIONS

Olken et al., "Object Lessons Learned from a Distributed System for Remote Building Monitoring and Operation," ACM SIGPLAN Notices, vol. 33, No. 10, pp. 284-295, Oct. 1998.
(Continued)

*Primary Examiner* — Van T Trieu
(74) *Attorney, Agent, or Firm* — Seager, Tufte & Wickhem, LLP

(57) ABSTRACT

A sensor assembly includes a housing, a sensor, and a transmitter. A power supply is configured to power the sensor assembly. A light harvesting element is configured to convert incident light into electrical energy for replenishing the power stored by the power supply. A controller activates and deactivates the sensor in accordance with a first activation schedule. The controller monitors a power reserve parameter of the power supply. When the power reserve parameter drops below a first power reserve threshold, the controller alters the activation schedule to a second activation schedule for the sensor that reduces power consumption from the power supply. After the light harvesting element replenishes the power stored by the power supply above a second power reserve threshold, the controller alters the activation schedule to return to the first activation schedule.

20 Claims, 5 Drawing Sheets

(51) Int. Cl.
*G01P 1/02* (2006.01)
*G01R 31/3842* (2019.01)

(58) Field of Classification Search
CPC .......... H02J 50/00; H02J 50/30; H02J 50/001; H04W 52/00; H04W 52/02; H04W 4/00
See application file for complete search history.

(56) References Cited

U.S. PATENT DOCUMENTS

| | | |
|---|---|---|
| 4,375,637 A | 3/1983 | Desjardins |
| 4,918,615 A | 4/1990 | Suzuki et al. |
| 4,939,922 A | 7/1990 | Smalley et al. |
| 5,566,084 A | 10/1996 | Cmar |
| 5,727,579 A | 3/1998 | Chardack |
| 5,745,126 A | 4/1998 | Jain et al. |
| 5,751,916 A | 5/1998 | Kon et al. |
| 5,777,598 A | 7/1998 | Gowda et al. |
| 5,973,662 A | 10/1999 | Singers et al. |
| 6,065,842 A | 5/2000 | Fink |
| 6,139,177 A | 10/2000 | Venkatraman et al. |
| 6,144,993 A | 11/2000 | Fukunaga et al. |
| 6,157,943 A | 12/2000 | Meyer |
| 6,229,429 B1 | 5/2001 | Horon |
| 6,238,337 B1 | 5/2001 | Kambhatla et al. |
| 6,250,601 B1 | 6/2001 | Kolar et al. |
| 6,334,211 B1 | 12/2001 | Kojima et al. |
| 6,353,853 B1 | 3/2002 | Gravlin |
| 6,369,695 B2 | 4/2002 | Horon |
| 6,375,038 B1 | 4/2002 | Daansen et al. |
| 6,429,868 B1 | 8/2002 | Dehner, Jr. et al. |
| 6,473,084 B1 | 10/2002 | Phillips et al. |
| 6,487,457 B1 | 11/2002 | Hull et al. |
| 6,580,950 B1 | 6/2003 | Johnson et al. |
| 6,598,056 B1 | 7/2003 | Hull et al. |
| 6,619,555 B2 | 9/2003 | Rosen |
| 6,704,012 B1 | 3/2004 | Lefave |
| 6,712,269 B1 | 3/2004 | Watkins |
| 6,720,874 B2 | 4/2004 | Fufido et al. |
| 6,741,915 B2 | 5/2004 | Poth |
| 6,796,896 B2 | 9/2004 | Laiti |
| 6,801,199 B1 | 10/2004 | Wallman |
| 6,816,878 B1 | 11/2004 | Zimmers et al. |
| 6,876,951 B2 | 4/2005 | Skidmore et al. |
| 6,882,278 B2 | 4/2005 | Winings et al. |
| 6,904,385 B1 | 6/2005 | Budike, Jr. |
| 6,907,387 B1 | 6/2005 | Reardon |
| 6,911,177 B2 | 6/2005 | Deal |
| 6,993,403 B1 | 1/2006 | Dadebo et al. |
| 6,993,417 B2 | 1/2006 | Osann, Jr. |
| 7,023,440 B1 | 4/2006 | Havekost et al. |
| 7,031,880 B1 | 4/2006 | Seem et al. |
| 7,062,722 B1 | 6/2006 | Carlin et al. |
| 7,110,843 B2 | 9/2006 | Pagnano et al. |
| 7,139,685 B2 | 11/2006 | Bascle et al. |
| 7,164,972 B2 | 1/2007 | Imhof et al. |
| 7,183,899 B2 | 2/2007 | Behnke |
| 7,200,639 B1 | 4/2007 | Yoshida |
| 7,222,111 B1 | 5/2007 | Budike, Jr. |
| 7,222,800 B2 | 5/2007 | Wruck |
| 7,257,397 B2 | 8/2007 | Shamoon et al. |
| 7,280,030 B1 | 10/2007 | Monaco |
| 7,292,908 B2 | 11/2007 | Borne et al. |
| 7,295,116 B2 | 11/2007 | Kumar et al. |
| 7,302,313 B2 | 11/2007 | Sharp et al. |
| 7,308,323 B2 | 12/2007 | Kruk et al. |
| 7,308,388 B2 | 12/2007 | Beverina et al. |
| 7,313,447 B2 | 12/2007 | Hsiung et al. |
| 7,346,433 B2 | 3/2008 | Budike, Jr. |
| 7,356,548 B1 | 4/2008 | Culp et al. |
| 7,379,782 B1 | 5/2008 | Cocco |
| 7,383,148 B2 | 6/2008 | Ahmed |
| 7,434,742 B2 | 10/2008 | Mueller et al. |
| 7,447,333 B1 | 11/2008 | Masticola et al. |
| 7,466,224 B2 | 12/2008 | Ward et al. |
| 7,496,472 B2 | 2/2009 | Seem |
| 7,512,450 B2 | 3/2009 | Ahmed |
| 7,516,490 B2 | 4/2009 | Riordan et al. |
| 7,548,833 B2 | 6/2009 | Ahmed |
| 7,551,092 B1 | 6/2009 | Henry |
| 7,552,030 B2 | 6/2009 | Guralnik et al. |
| 7,557,729 B2 | 7/2009 | Hubbard et al. |
| 7,567,844 B2 | 7/2009 | Thomas et al. |
| 7,596,473 B2 | 9/2009 | Hansen et al. |
| 7,610,910 B2 | 11/2009 | Ahmed |
| 7,626,507 B2 | 12/2009 | LaCasse |
| 7,664,574 B2 | 2/2010 | Imhof et al. |
| 7,682,464 B2 | 3/2010 | Glenn et al. |
| 7,688,212 B2 | 3/2010 | Farley |
| 7,702,421 B2 | 4/2010 | Sullivan et al. |
| 7,729,882 B2 | 6/2010 | Seem |
| 7,755,494 B2 | 7/2010 | Melker et al. |
| 7,761,310 B2 | 7/2010 | Rodgers |
| 7,774,227 B2 | 8/2010 | Srivastava |
| 7,797,188 B2 | 9/2010 | Srivastava |
| 7,819,136 B1 | 10/2010 | Eddy |
| 7,822,806 B2 | 10/2010 | Frank et al. |
| 7,856,370 B2 | 12/2010 | Katta et al. |
| 7,944,358 B2 | 5/2011 | Sorensen et al. |
| 7,978,083 B2 | 7/2011 | Melker et al. |
| 7,984,384 B2 | 7/2011 | Chaudhri et al. |
| 7,986,323 B2 | 7/2011 | Kobayashi et al. |
| 8,014,970 B2 | 9/2011 | Gulati et al. |
| 8,024,666 B2 | 9/2011 | Thompson |
| 8,051,156 B1 | 11/2011 | Sharma et al. |
| 8,086,047 B2 | 12/2011 | Penke et al. |
| 8,099,178 B2 | 1/2012 | Mairs et al. |
| 8,151,280 B2 | 4/2012 | Sather et al. |
| 8,176,095 B2 | 5/2012 | Murray et al. |
| 8,218,871 B2 | 7/2012 | Angell et al. |
| 8,219,660 B2 | 7/2012 | McCoy et al. |
| 8,271,941 B2 | 9/2012 | Zhang et al. |
| 8,294,585 B2 | 10/2012 | Barnhill |
| 8,302,020 B2 | 10/2012 | Louch et al. |
| 8,320,634 B2 | 11/2012 | Deutsch |
| 8,334,422 B2 | 12/2012 | Gutsol et al. |
| 8,344,893 B1 | 1/2013 | Drammeh |
| 8,375,118 B2 | 2/2013 | Hao et al. |
| 8,395,515 B2 | 3/2013 | Tokhtuev et al. |
| 8,476,590 B2 | 7/2013 | Stratmann et al. |
| 8,516,016 B2 | 8/2013 | Park et al. |
| 8,558,660 B2 | 10/2013 | Nix et al. |
| 8,639,527 B2 | 1/2014 | Rensvold et al. |
| 8,698,637 B2 | 4/2014 | Raichman |
| 8,718,981 B2 | 5/2014 | Bey et al. |
| 8,816,860 B2 | 8/2014 | Ophardt et al. |
| 8,869,027 B2 | 10/2014 | Louch et al. |
| 8,904,497 B2 | 12/2014 | Hsieh |
| 8,936,944 B2 | 1/2015 | Peltz et al. |
| 8,947,437 B2 | 2/2015 | Garr et al. |
| 8,950,019 B2 | 2/2015 | Loberger et al. |
| 9,000,926 B2 | 4/2015 | Hollock et al. |
| 9,030,325 B2 | 5/2015 | Taneff |
| 9,098,738 B2 | 8/2015 | Bilet et al. |
| 9,098,993 B2 | 8/2015 | Reed, Jr. |
| 9,105,071 B2 | 8/2015 | Fletcher et al. |
| 9,175,356 B2 | 11/2015 | Peltz et al. |
| 9,240,111 B2 | 1/2016 | Scott et al. |
| 9,280,884 B1 | 3/2016 | Schultz et al. |
| 9,292,972 B2 | 3/2016 | Hailemariam et al. |
| 9,320,662 B2 | 4/2016 | Hayes et al. |
| 9,370,600 B1 | 6/2016 | DuPuis et al. |
| 9,373,242 B1 | 6/2016 | Conrad et al. |
| 9,396,638 B2 | 7/2016 | Wildman et al. |
| 9,311,807 B2 | 8/2016 | Schultz et al. |
| 9,406,212 B2 | 8/2016 | De Luca et al. |
| 9,418,535 B1 | 8/2016 | Felch et al. |
| 9,418,536 B1 | 8/2016 | Felch et al. |
| 9,449,219 B2 | 9/2016 | Bilet et al. |
| 9,477,543 B2 | 10/2016 | Henley et al. |
| 9,497,832 B2 | 11/2016 | Verberkt et al. |
| 9,513,364 B2 | 12/2016 | Hall et al. |
| 9,526,380 B2 | 12/2016 | Hamilton et al. |
| 9,526,806 B2 | 12/2016 | Park et al. |
| 9,536,415 B2 | 1/2017 | De Luca et al. |

(56) References Cited

U.S. PATENT DOCUMENTS

| | | |
|---|---|---|
| 9,538,578 B1 | 1/2017 | Stamakakis et al. |
| 9,558,648 B2 | 1/2017 | Douglas |
| 9,591,267 B2 | 3/2017 | Lipton et al. |
| 9,613,518 B2 | 4/2017 | Dunn et al. |
| 9,614,723 B2 | 4/2017 | Koningstein et al. |
| 9,618,224 B2 | 4/2017 | Emmons et al. |
| 9,618,918 B2 | 4/2017 | O'Keefe |
| 9,640,059 B2 | 5/2017 | Hyland |
| 9,672,360 B2 | 6/2017 | Barkan |
| 9,685,065 B2 | 6/2017 | Diels |
| 9,710,700 B2 | 7/2017 | Bilet et al. |
| 9,715,242 B2 | 7/2017 | Pillai et al. |
| 9,721,452 B2 | 8/2017 | Felch et al. |
| 9,729,341 B2 | 8/2017 | Kaps et al. |
| 9,729,945 B2 | 8/2017 | Schultz et al. |
| 9,784,464 B2 | 10/2017 | Yamamoto et al. |
| 9,843,743 B2 | 12/2017 | Lewis et al. |
| 9,856,634 B2 | 1/2018 | Rodenbeck et al. |
| 9,872,088 B2 | 1/2018 | Fadell et al. |
| 9,875,639 B2 | 1/2018 | Bone et al. |
| 9,911,312 B2 | 3/2018 | Wildman et al. |
| 9,940,819 B2 | 4/2018 | Ferniany |
| 9,956,306 B2 | 5/2018 | Brais et al. |
| 9,986,175 B2 | 5/2018 | Frank et al. |
| 10,087,608 B2 | 10/2018 | Dobizl et al. |
| 10,171,891 B1 | 1/2019 | Stamatakis |
| 10,223,894 B2 | 3/2019 | Raichman |
| 10,228,837 B2 | 3/2019 | Hua et al. |
| 10,235,865 B2 | 3/2019 | Thyroff |
| 10,251,610 B2 | 4/2019 | Parthasarathy et al. |
| 10,298,411 B2 | 5/2019 | Donlan et al. |
| 10,303,843 B2 | 5/2019 | Bitran et al. |
| 10,332,382 B2 | 6/2019 | Thyroff |
| 10,382,893 B1 | 8/2019 | Wootton et al. |
| 10,448,491 B1 * | 10/2019 | Recker ............... H05B 47/16 |
| 10,469,590 B2 | 11/2019 | Scanlin et al. |
| 10,513,416 B2 | 12/2019 | Fang et al. |
| 10,514,817 B2 | 12/2019 | Hua et al. |
| 10,542,477 B2 | 1/2020 | Johnston |
| 10,565,844 B2 | 2/2020 | Pourmohammad et al. |
| 10,602,474 B2 | 3/2020 | Goldstein |
| 10,607,147 B2 | 3/2020 | Raykov et al. |
| 10,609,304 B2 | 3/2020 | Soper et al. |
| 10,613,504 B2 | 4/2020 | Chowdhury |
| 10,659,289 B2 | 5/2020 | Shif et al. |
| 10,691,081 B2 | 6/2020 | Ray |
| 10,705,108 B1 | 7/2020 | Moens et al. |
| 10,708,154 B2 | 7/2020 | Pefkianakis et al. |
| 10,721,088 B2 | 7/2020 | Saxena et al. |
| 10,866,003 B2 | 12/2020 | Ajax |
| 10,944,830 B2 | 3/2021 | Scanlin |
| 11,323,786 B2 | 5/2022 | Collin et al. |
| 2002/0111698 A1 | 8/2002 | Graziano et al. |
| 2002/0130868 A1 | 9/2002 | Smith |
| 2003/0028269 A1 | 2/2003 | Spriggs et al. |
| 2003/0030637 A1 | 2/2003 | Grinstein et al. |
| 2003/0046862 A1 | 3/2003 | Wolf et al. |
| 2003/0071814 A1 | 4/2003 | Jou et al. |
| 2003/0078677 A1 | 4/2003 | Hull et al. |
| 2003/0083957 A1 | 5/2003 | Olefson |
| 2003/0103075 A1 | 6/2003 | Rosselot |
| 2003/0171851 A1 | 9/2003 | Brickfield et al. |
| 2003/0214400 A1 | 11/2003 | Mizutani et al. |
| 2003/0233432 A1 | 12/2003 | Davis et al. |
| 2004/0001009 A1 | 1/2004 | Winings et al. |
| 2004/0030531 A1 | 2/2004 | Miller et al. |
| 2004/0064260 A1 | 4/2004 | Padmanabhan et al. |
| 2004/0143474 A1 | 7/2004 | Haeberle et al. |
| 2004/0153437 A1 | 8/2004 | Buchan |
| 2004/0168115 A1 | 8/2004 | Bauernschmidt et al. |
| 2004/0233192 A1 | 11/2004 | Hopper |
| 2004/0260411 A1 | 12/2004 | Cannon |
| 2005/0010460 A1 | 1/2005 | Mizoguchi et al. |
| 2005/0119767 A1 | 6/2005 | Kiwimagi et al. |
| 2005/0143863 A1 | 6/2005 | Ruane et al. |
| 2005/0267900 A1 | 12/2005 | Ahmed et al. |
| 2006/0004841 A1 | 1/2006 | Heikkonen et al. |
| 2006/0009862 A1 | 1/2006 | Imhof et al. |
| 2006/0017547 A1 | 1/2006 | Buckingham et al. |
| 2006/0020177 A1 | 1/2006 | Seo et al. |
| 2006/0028471 A1 | 2/2006 | Kincaid et al. |
| 2006/0029256 A1 | 2/2006 | Miyoshi et al. |
| 2006/0058900 A1 | 3/2006 | Johanson et al. |
| 2006/0067545 A1 | 3/2006 | Lewis et al. |
| 2006/0067546 A1 | 3/2006 | Lewis et al. |
| 2006/0077255 A1 | 4/2006 | Cheng |
| 2006/0184326 A1 | 8/2006 | McNally et al. |
| 2006/0231568 A1 | 10/2006 | Lynn et al. |
| 2006/0265664 A1 | 11/2006 | Simons et al. |
| 2006/0279630 A1 | 12/2006 | Aggarwal et al. |
| 2007/0016955 A1 | 1/2007 | Goldberg et al. |
| 2007/0055757 A1 | 3/2007 | Mairs et al. |
| 2007/0055760 A1 | 3/2007 | McCoy et al. |
| 2007/0061046 A1 | 3/2007 | Mairs et al. |
| 2007/0067062 A1 | 3/2007 | Mairs et al. |
| 2007/0088534 A1 | 4/2007 | MacArthur et al. |
| 2007/0090951 A1 | 4/2007 | Chan et al. |
| 2007/0091091 A1 | 4/2007 | Gardiner et al. |
| 2007/0101433 A1 | 5/2007 | Louch et al. |
| 2007/0114295 A1 | 5/2007 | Jenkins |
| 2007/0120652 A1 | 5/2007 | Behnke |
| 2007/0139208 A1 | 6/2007 | Kates |
| 2007/0216682 A1 | 9/2007 | Navratil et al. |
| 2007/0219645 A1 | 9/2007 | Thomas et al. |
| 2007/0239484 A1 | 10/2007 | Arond et al. |
| 2007/0268122 A1 | 11/2007 | Kow et al. |
| 2008/0001763 A1 | 1/2008 | Raja et al. |
| 2008/0027587 A1 | 1/2008 | Nickerson et al. |
| 2008/0027885 A1 | 1/2008 | Van Putten et al. |
| 2008/0036593 A1 | 2/2008 | Rose-Pehrsson et al. |
| 2008/0062167 A1 | 3/2008 | Boggs et al. |
| 2008/0067244 A1 | 3/2008 | Marks |
| 2008/0099045 A1 | 5/2008 | Glenn et al. |
| 2008/0103798 A1 | 5/2008 | Domenikos et al. |
| 2008/0120396 A1 | 5/2008 | Jayaram et al. |
| 2008/0144885 A1 | 6/2008 | Zucherman et al. |
| 2008/0183424 A1 | 7/2008 | Seem |
| 2008/0194009 A1 | 8/2008 | Marentis |
| 2008/0198231 A1 | 8/2008 | Ozdemir et al. |
| 2008/0209342 A1 | 8/2008 | Taylor et al. |
| 2008/0222565 A1 | 9/2008 | Taylor et al. |
| 2008/0224862 A1 | 9/2008 | Cirker |
| 2008/0242945 A1 | 10/2008 | Gugliotti et al. |
| 2008/0250800 A1 | 10/2008 | Wetzel |
| 2008/0279420 A1 | 11/2008 | Masticola et al. |
| 2008/0280275 A1 | 11/2008 | Collopy |
| 2008/0303658 A1 | 12/2008 | Melker et al. |
| 2008/0306985 A1 | 12/2008 | Murray et al. |
| 2008/0320552 A1 | 12/2008 | Kumar et al. |
| 2009/0001181 A1 | 1/2009 | Siddaramanna et al. |
| 2009/0024944 A1 | 1/2009 | Louch et al. |
| 2009/0065596 A1 | 3/2009 | Seem et al. |
| 2009/0083120 A1 | 3/2009 | Strichman et al. |
| 2009/0096791 A1 | 4/2009 | Abshear et al. |
| 2009/0125337 A1 | 5/2009 | Abri |
| 2009/0125825 A1 | 5/2009 | Rye et al. |
| 2009/0144023 A1 | 6/2009 | Seem |
| 2009/0157744 A1 | 6/2009 | McConnell |
| 2009/0160673 A1 | 6/2009 | Cirker |
| 2009/0237651 A1 | 9/2009 | Arndt et al. |
| 2009/0322782 A1 | 12/2009 | Kimchi et al. |
| 2010/0048167 A1 | 2/2010 | Chow et al. |
| 2010/0058248 A1 | 3/2010 | Park |
| 2010/0064001 A1 | 3/2010 | Daily |
| 2010/0070089 A1 | 3/2010 | Harrod et al. |
| 2010/0073162 A1 | 3/2010 | Johnson et al. |
| 2010/0103019 A1 | 4/2010 | Ammar |
| 2010/0123560 A1 | 5/2010 | Nix et al. |
| 2010/0134296 A1 | 6/2010 | Hwang |
| 2010/0156628 A1 | 6/2010 | Ainsbury et al. |
| 2010/0156630 A1 | 6/2010 | Ainsbury |
| 2010/0188228 A1 | 7/2010 | Hyland |
| 2010/0223198 A1 | 9/2010 | Noureldin et al. |
| 2010/0249955 A1 | 9/2010 | Sitton |

(56) References Cited

U.S. PATENT DOCUMENTS

| | | |
|---|---|---|
| 2010/0286937 A1 | 11/2010 | Hedley et al. |
| 2010/0318200 A1 | 12/2010 | Foslien et al. |
| 2010/0324962 A1 | 12/2010 | Nesler et al. |
| 2011/0010654 A1 | 1/2011 | Raymond et al. |
| 2011/0057799 A1 | 3/2011 | Taneff |
| 2011/0077779 A1 | 3/2011 | Fuller et al. |
| 2011/0083094 A1 | 4/2011 | Laycock et al. |
| 2011/0087988 A1 | 4/2011 | Ray et al. |
| 2011/0112854 A1 | 5/2011 | Koch et al. |
| 2011/0126111 A1 | 5/2011 | Gill et al. |
| 2011/0154426 A1 | 6/2011 | Doser et al. |
| 2011/0161124 A1 | 6/2011 | Lappinga et al. |
| 2011/0169646 A1 | 7/2011 | Raichman |
| 2011/0184563 A1 | 7/2011 | Foslien et al. |
| 2011/0202467 A1 | 8/2011 | Hilber et al. |
| 2011/0273298 A1 | 11/2011 | Snodgrass et al. |
| 2011/0291841 A1 | 12/2011 | Hollock et al. |
| 2011/0295583 A1 | 12/2011 | Hollock et al. |
| 2011/0298301 A1 | 12/2011 | Wong et al. |
| 2011/0316703 A1 | 12/2011 | Butler et al. |
| 2011/0320054 A1 | 12/2011 | Brzezowski |
| 2012/0022700 A1 | 1/2012 | Drees et al. |
| 2012/0039503 A1 | 2/2012 | Chen et al. |
| 2012/0062382 A1 | 3/2012 | Taneff |
| 2012/0066168 A1 | 3/2012 | Fadell |
| 2012/0075464 A1 | 3/2012 | Derenne et al. |
| 2012/0109988 A1 | 5/2012 | Li et al. |
| 2012/0112883 A1 | 5/2012 | Wallace et al. |
| 2012/0112906 A1 | 5/2012 | Borke et al. |
| 2012/0131217 A1 | 5/2012 | Delorme et al. |
| 2012/0158185 A1 | 6/2012 | El-Mankabady et al. |
| 2012/0216243 A1 | 8/2012 | Gill et al. |
| 2012/0224057 A1 | 9/2012 | Gill et al. |
| 2012/0256492 A1 | 10/2012 | Song et al. |
| 2012/0259466 A1 | 10/2012 | Ray et al. |
| 2012/0262472 A1 | 10/2012 | Garr et al. |
| 2012/0272146 A1 | 10/2012 | D'souza et al. |
| 2012/0276517 A1 | 11/2012 | Banaszuk et al. |
| 2012/0291068 A1 | 11/2012 | Khushoo et al. |
| 2012/0303652 A1 | 11/2012 | Tseng |
| 2012/0310418 A1 | 12/2012 | Harrod et al. |
| 2013/0007316 A1 | 1/2013 | Moon et al. |
| 2013/0055132 A1 | 2/2013 | Foslien |
| 2013/0060794 A1 | 3/2013 | Puttabasappa et al. |
| 2013/0082842 A1 | 4/2013 | Balazs et al. |
| 2013/0086152 A1 | 4/2013 | Hersche et al. |
| 2013/0091631 A1 | 4/2013 | Hayes et al. |
| 2013/0110295 A1 | 5/2013 | Zheng et al. |
| 2013/0169681 A1 | 7/2013 | Rasane et al. |
| 2013/0184880 A1 | 7/2013 | McMahon |
| 2013/0187775 A1 | 7/2013 | Marsden et al. |
| 2013/0204570 A1 | 8/2013 | Mendelson et al. |
| 2013/0229276 A1 | 9/2013 | Hunter |
| 2013/0268293 A1 | 10/2013 | Knudson et al. |
| 2013/0289774 A1 | 10/2013 | Day et al. |
| 2014/0032157 A1 | 1/2014 | Khiani |
| 2014/0040998 A1 | 2/2014 | Hsieh |
| 2014/0046490 A1 | 2/2014 | Foslien et al. |
| 2014/0046722 A1 | 2/2014 | Rosenbloom et al. |
| 2014/0058539 A1 | 2/2014 | Park |
| 2014/0079282 A1 | 3/2014 | Marcheselli |
| 2014/0125497 A1* | 5/2014 | Uchiyama ............... H04W 4/70 340/870.16 |
| 2014/0167917 A2 | 6/2014 | Wallace et al. |
| 2014/0207291 A1 | 7/2014 | Golden et al. |
| 2014/0266693 A1 | 9/2014 | Moulton |
| 2014/0292518 A1 | 10/2014 | Wildman et al. |
| 2014/0307076 A1 | 10/2014 | Deutsch |
| 2014/0309757 A1 | 10/2014 | Le Sant et al. |
| 2014/0316582 A1 | 10/2014 | Berg-Sonne et al. |
| 2014/0320289 A1 | 10/2014 | Raichman |
| 2014/0342724 A1 | 11/2014 | Hill et al. |
| 2015/0022316 A1 | 1/2015 | Dixon et al. |
| 2015/0025329 A1 | 1/2015 | Amarasingham et al. |
| 2015/0032264 A1 | 1/2015 | Emmons et al. |
| 2015/0056909 A1 | 2/2015 | Chien |
| 2015/0070174 A1 | 3/2015 | Douglas |
| 2015/0077258 A1 | 3/2015 | Nelson et al. |
| 2015/0113462 A1 | 4/2015 | Chen et al. |
| 2015/0153918 A1 | 6/2015 | Chen et al. |
| 2015/0156567 A1 | 6/2015 | Oliver et al. |
| 2015/0161874 A1 | 6/2015 | Thyroff et al. |
| 2015/0167995 A1 | 6/2015 | Fadell et al. |
| 2015/0168949 A1 | 6/2015 | Hua et al. |
| 2015/0194043 A1 | 7/2015 | Dunn et al. |
| 2015/0198707 A1 | 7/2015 | Al-Alusi |
| 2015/0212717 A1 | 7/2015 | Nair et al. |
| 2015/0213222 A1 | 7/2015 | Amarasingham et al. |
| 2015/0213379 A1 | 7/2015 | Nair et al. |
| 2015/0216369 A1 | 8/2015 | Hamilton et al. |
| 2015/0253748 A1 | 9/2015 | Brun et al. |
| 2015/0281287 A1 | 10/2015 | Gill et al. |
| 2015/0310312 A1 | 10/2015 | Mongeon |
| 2015/0372536 A1 | 12/2015 | Naskali et al. |
| 2016/0027278 A1 | 1/2016 | McIntosh et al. |
| 2016/0061476 A1 | 3/2016 | Schultz et al. |
| 2016/0061477 A1 | 3/2016 | Schultz et al. |
| 2016/0061794 A1 | 3/2016 | Schultz et al. |
| 2016/0061795 A1 | 3/2016 | Schultz et al. |
| 2016/0063833 A1 | 3/2016 | Schultz et al. |
| 2016/0066067 A1 | 3/2016 | Schultz et al. |
| 2016/0110833 A1 | 4/2016 | Fix |
| 2016/0116181 A1 | 4/2016 | Aultman et al. |
| 2016/0132032 A1* | 5/2016 | Bruneel ............ H02J 13/00002 700/295 |
| 2016/0139067 A1 | 5/2016 | Grace |
| 2016/0253897 A1 | 9/2016 | Wildman et al. |
| 2016/0255516 A1 | 9/2016 | Hill et al. |
| 2016/0298864 A1 | 10/2016 | Ekolind et al. |
| 2016/0306934 A1 | 10/2016 | Sperry et al. |
| 2016/0314683 A1 | 10/2016 | Felch et al. |
| 2016/0328948 A1 | 11/2016 | Ferniany |
| 2016/0335731 A1 | 11/2016 | Hall |
| 2016/0367925 A1 | 12/2016 | Blackley |
| 2016/0371619 A1 | 12/2016 | Foster |
| 2017/0024986 A1 | 1/2017 | Austin |
| 2017/0193792 A1 | 7/2017 | Bermudez Rodriguez et al. |
| 2017/0256155 A1 | 9/2017 | Sengstaken, Jr. |
| 2017/0280949 A1 | 10/2017 | Wildman et al. |
| 2017/0294106 A1 | 10/2017 | Thyroff |
| 2017/0323376 A1 | 11/2017 | Glaser et al. |
| 2017/0363721 A1 | 12/2017 | Yang et al. |
| 2017/0365024 A1 | 12/2017 | Koch et al. |
| 2018/0004178 A1 | 1/2018 | Haines |
| 2018/0005382 A1 | 1/2018 | Wang et al. |
| 2018/0016773 A1 | 1/2018 | Chandler et al. |
| 2018/0053397 A1 | 2/2018 | Kaur |
| 2018/0106897 A1 | 4/2018 | Shouldice et al. |
| 2018/0113897 A1 | 4/2018 | Donlan |
| 2018/0120412 A1 | 5/2018 | Kim |
| 2018/0151054 A1 | 5/2018 | Pi |
| 2018/0218591 A1 | 8/2018 | Easter |
| 2018/0292098 A1 | 10/2018 | Bandyopadhyay et al. |
| 2018/0293038 A1 | 10/2018 | Meruva et al. |
| 2018/0301014 A1 | 10/2018 | Worral et al. |
| 2018/0313695 A1 | 11/2018 | Shim et al. |
| 2018/0365957 A1 | 12/2018 | Wright et al. |
| 2019/0012607 A1 | 1/2019 | Holliday |
| 2019/0035250 A1 | 1/2019 | Hunter et al. |
| 2019/0049139 A1 | 2/2019 | Ko |
| 2019/0051138 A1 | 2/2019 | Easter |
| 2019/0139395 A1 | 5/2019 | Rogachev et al. |
| 2019/0209719 A1 | 7/2019 | Andersen et al. |
| 2019/0227156 A1 | 7/2019 | Santra et al. |
| 2019/0295386 A1 | 9/2019 | Roberts |
| 2019/0323897 A1 | 10/2019 | Wang et al. |
| 2020/0009280 A1 | 1/2020 | Kupa et al. |
| 2020/0074836 A1 | 3/2020 | Kolavennu et al. |
| 2020/0090089 A1 | 3/2020 | Aston et al. |
| 2020/0146557 A1 | 5/2020 | Cheung et al. |
| 2020/0162503 A1 | 5/2020 | Shurtleff et al. |
| 2020/0177485 A1 | 6/2020 | Shurtleff et al. |
| 2020/0200420 A1 | 6/2020 | Nayak et al. |
| 2020/0226363 A1 | 7/2020 | Holliday et al. |

(56) References Cited

U.S. PATENT DOCUMENTS

| | | | |
|---|---|---|---|
| 2020/0327315 A1 | 10/2020 | Mullins | |
| 2020/0364999 A1 | 11/2020 | Mullins | |
| 2021/0027882 A1 | 1/2021 | Wellig | |
| 2021/0150380 A1 | 5/2021 | Verteletskyi et al. | |
| 2021/0174973 A1 | 6/2021 | Munoz | |
| 2021/0208555 A1 | 7/2021 | Palanivel et al. | |
| 2021/0356417 A1 | 11/2021 | Babakhani et al. | |
| 2021/0396861 A1 | 12/2021 | Wellig | |
| 2022/0021667 A1 | 1/2022 | Wellig et al. | |
| 2022/0333979 A1* | 10/2022 | McAllister | G01J 1/0271 |
| 2024/0167716 A1* | 5/2024 | Shinoda | F24F 11/64 |

FOREIGN PATENT DOCUMENTS

| | | |
|---|---|---|
| CN | 103110410 A | 5/2013 |
| CN | 103970977 A | 8/2014 |
| CN | 105116848 A | 12/2015 |
| CN | 108961714 A | 12/2018 |
| CN | 110009245 A | 7/2019 |
| CN | 110084928 A | 8/2019 |
| CN | 110456343 A | 11/2019 |
| CN | 209785093 U | 12/2019 |
| CN | 110827457 A | 2/2020 |
| EP | 1669912 A1 | 6/2006 |
| EP | 2310981 A1 | 4/2011 |
| EP | 1628514 B1 | 5/2011 |
| EP | 3723456 A1 | 10/2020 |
| IN | 369935 A1 | 10/2015 |
| JP | 7085166 A | 3/1995 |
| JP | 11024735 A | 1/1999 |
| JP | 11317936 A | 11/1999 |
| JP | 2001356813 A | 12/2001 |
| JP | 2005242531 A | 9/2005 |
| JP | 2005311563 A | 11/2005 |
| KR | 10195017 B1 | 12/2011 |
| KR | 1172747 B1 | 8/2012 |
| KR | 101445367 B1 | 10/2014 |
| KR | 1499081 B1 | 3/2015 |
| KR | 2019059359 A | 5/2019 |
| WO | 9621264 A3 | 11/1996 |
| WO | 2004029518 A1 | 4/2004 |
| WO | 2005045715 A2 | 5/2005 |
| WO | 2008152433 A1 | 12/2008 |
| WO | 2008157755 A1 | 12/2008 |
| WO | 2009012319 A2 | 1/2009 |
| WO | 2009079648 A1 | 6/2009 |
| WO | 2010106474 A1 | 9/2010 |
| WO | 2011025085 A1 | 3/2011 |
| WO | 2011043732 A1 | 4/2011 |
| WO | 2011057173 A2 | 5/2011 |
| WO | 2011123743 A1 | 10/2011 |
| WO | 2013062725 A1 | 5/2013 |
| WO | 2013178819 A1 | 12/2013 |
| WO | 2014009291 A1 | 1/2014 |
| WO | 2014098861 A1 | 6/2014 |
| WO | 2014135517 A1 | 9/2014 |
| WO | 2016123536 A1 | 8/2016 |
| WO | 2017057274 A1 | 4/2017 |
| WO | 2018206934 A1 | 11/2018 |
| WO | 2019046580 A1 | 3/2019 |
| WO | 2020024553 A1 | 2/2020 |
| WO | 2020184831 A1 | 9/2020 |

OTHER PUBLICATIONS

Proliphix, Inc., "Proliphix IP Devices: HTTP API," 28 pages, Jan. 23, 2006.
Proliphix, Inc., Remote Management User Guide, 12 pages, prior to Aug. 27, 2007.
Rogan et al., "Smart and Final Food Stores: A Case Study in Web Based Energy Information and Collection," Web Based Energy Information and Control Systems: Case Studies and Application, Chapter 6, p. 59-64, 2005.
Sharp, "Actius AL3DU 3D LC Display High Performance 3D Visualization," 2 pages, prior to Mar. 17, 2006.
So et al., "Building Automation on the Information Superhighway," ASHRAE (American Society of Heating Refrigerating, and Air Conditioning) Transactions, vol. 104, Part 2, pp. 176-191, 1998.
So et al., "Building Automation Systems on the Internet," Facilities vol. 15, No. 5/6, pp. 125-133, May/Jun. 1997.
Talon, "Raptor Controller," 6 pages, Oct. 2003.
Talon, "Workstation Software," 4 pages, Nov. 2002.
Trane, "System Programming, Tracer Summit Version 14, BMTW-SVP01D-EN," 623 pages, 2002.
Lucid Design Group, Inc., "Building Dashboard," 2 pages, Printed May 30, 2013.
"America's Largest Managed Security Services Provider Launches Comprehensive, Integrated Covid-19 Safety Program for Office Buildings and Suites," KastleSafeSpaces, 5 pages, May 11, 2020.
"Biometric Door Reader With Body Temperature Detection," Kintronics, 9 pages, accessed May 21, 2020.
"Body Surface Temperature Screening with Alarm Function TVS-200IS/TVS-500IS," Nippon Avionics Co., 3 pages, accessed May 21, 2020.
"BriefCam announces video analytics innovation for contact tracing, physical distancing, occupancy management and face mask detection," BriefCam LTD, 11 pages, Jun. 5, 2020.
"Thermal Imaging SmartPhone Can Be used For Temperature Screening of People," CAT, 3 pages, accessed Jul. 13, 2020.
"Contact Tracing Now Available on Identiv's Hirsch Velocity Access Control Platform," Identiv, 5 pages, May 21, 2020.
Silva et al., "Cough localization for the detection of respiratory diseases in pig houses," ScienceDirect, 7 pages, May 28, 2008.
Oey et al., "Evaluation of Isolation Compliance Using Real Time Video In Critical Care," North Shore University Hospital, 1 page, Oct. 9, 2015.
"Facial Attendace System With Temperature Screening Now In India," IANS, 5 pages, Mar. 19, 2020.
"Plan to Re-Open," EHIGH, 16 pages, accessed Jun. 13, 2020.
"How Smarter AI-Powered Cameras Can Mitigate the Spread of Wuhan Novel," AnyConnect, 22 pages, 2020.
"How to fight COVID-19 with machine learning," DataRevenue, 20 pages, accessed May 25, 2020.
"Inncontrol 5," Honeywell, 2 pages, Aug. 8, 2018.
"IP Door Access Control," Kintronics, 21 pages, 2014.
"Kogniz AI Health Response Platform," Kogniz, 9 pages, accessed May 21, 2020.
"Machine Learning Could Check If You're Social Distancing Properly at Work," MIT Technology Review, 7 pages, Apr. 17, 2020.
Punn et al., "Monitoring COVID-19 social distancing with person detection and tracking via fine-tuned YOLO v3 and Deepsort techniques," 10 pages, May 6, 2020.
Burt, "NEC launches dual face biometric and fever detection system for access control," Biometric Update, 4 pages, May 8, 2020.
"Remote temperature monitoring," AXIS Communication, 10 pages, 2014.
"FebriEye-AI Based Thermal Temperature Screening System," vehant, 1 page, 2020.
"See The World In A New Way Hikvision Thermal Cameras," Hikvision, 12 pages, 2017.
Allain, "Trying out the iPhone Infrared Camera: The FLIR One," Wired, 15 pages, 2014.
Dasgupta, "Your voice may be able to tell you if you have Covid," Hindustan Times, 4 pages, Apr. 16, 2020.
Ganguty, "Gurugram-based startup Staqu has modified AI-powered JARVIS to battle coronavirus," Yourstory, 7 pages, Mar. 31, 2020.
"White Paper Usage of D6T-44L/D6T-8L Thermal Sensor," Omron Corporation, 18 Pages, 2013.
"MEMS: Thermal Sensors-D6T," Omron C Electronic Components LLC, 7 pages, Nov. 2012.
Extended European Search Report EP Application No. 20217467.8-1205, May 28, 2021 (6 pages).
Zhang et al; "Real-Time Human Motion Behavior Detection via CNN Using mmWave Radar," IEEE Sensors Council, 4 pages, Feb. 2019.
"A Sensor Above the Rest," Vayyar, 6 pages, accessed Oct. 7, 2020.

(56) References Cited

OTHER PUBLICATIONS

Thakur, "Infrared Sensors for Autonomous Vehicles," Intech Open, 17 pages, 2018.
"Presence Sensing", 1 page, accessed Jul. 21, 2021.
Trane, "Creating Input/Output Objects," 196 pages, retrieved Jul. 10, 2020.
Trane, "Using the Graphing Control Editor," 181 pages, retrieved Jul. 10, 2020.
"Belimo NFC, Frequently Asked Questions," Belimo Automation AG, 4 pages, 2022.
Dias et al; "Adapting Sampling Interval of Sensor Networks Using On-Line Reinforcement Learning," Department of Information and Communication Technologies, Universitat Pompeu Fabra, Barcelona, Spain, 6 pages, Jul. 12, 2016.
"Self-Powered Wireless Sensors in the Industrial Internet of Things," Tech Briefs Media Group, 10 pages, Sep. 1, 2017. Accessed Apr. 28, 2022.
Bocicor et al. "Wireless Sensor Network based System for the Prevention of Hospital Acquired Infections", arxiv.org, Cornell University Ithaca, NY 14853, May 2, 2017, XP080947042, (Abstract).
Shhedi et al., "Traditional and ICT Solutions for Preventing the Hospital Acquired Infection", 2015 20th International Conference on Control Systems and Computer Science, IEEE, May 27, 2015, pp. 867-873, XP033188038.
Extended European Search Report, EP application No. 20151295.1, pp. 13, May 26, 2020.
U.S. Appl. No. 14/109,496, filed Dec. 17, 2013.
"What is the GE Nucleus Home Manager? How can a Home Manager Help with Energy Conservation?" GE Nucleus, 2 pages, printed Jan. 15, 2013. www.geappliances.com/home-energy-manager/about-energy-monitors.htm.
"Lucid Design Group—Building Dashboard Network—Apps," 7 pages, Jan. 15, 2013. www.luciddesigngroup.com/network/apps.php#homepage.
Preuveneers et al., "Intelligent Widgets for Intuitive Interaction and Coordination in Smart Home Environments," IEEE Eighth International Conference on Intelligent Environments, pp. 157-164, 2012.
Wu et al., "A Web 2.0 Based Scientific Application Framework," 7 pages, prior to Jul. 24, 2014.
"The Home Dashboard," CRBM info@hand website, 46 pages, prior to Apr. 25, 2013.
"Free Facilities Dashboards," eSight Energy Website, 2 pages, prior to Apr. 25, 2013.
Alerton Building Controls, Gallery Prints, 7 pages, Dec. 19, 2013.
Carter, "Industrial Energy Management Dashboards Require a Toolkit," Cross Automation, 11 pages, Nov. 4, 2013.
U.S. Appl. No. 14/169,071, filed Jan. 30, 2014.
U.S. Appl. No. 14/169,083, filed Jan. 30, 2014.
U.S. Appl. No. 14/461,188, filed Aug. 15, 2014.
U.S. Appl. No. 14/482,607, filed Sep. 10, 2014.
e-homecontrols.com, "e-Home Controls Website," link to actual website no longer works, 1 page, prior to Dec. 19, 2013.
"C&C (/)—Omniboard," 5 pages, Dec. 19, 2013. http://www.ccbac.com.
"DomController Home Automation Software—Control Anything from Anywhere," 11 pages, printed Jan. 6, 2015. http://www.domcontroller.com/en/.
"Novar OPUS BAS," 1 page, prior to Feb. 13, 2013. http://www.novar.com/ems-bas/opus-building-automation-system.
"A 3D Interactive Environment for Automated Building Control," Master's Dissertation, Instituto Superior Tecnico, 120 pages, Nov. 2012.
Panduit Corp., "Enable a Building Automation with Panduit Enterprise Solutions," 4 pages, Nov. 2012.
Honeywell, "WEBs-AX Web-Enabled Building Solutions," sales brochure, Honeywell International Inc., Mar. 2009.
Honeywell, "Attune Advisory Services," press release, Honeywell International Inc., Mar. 20, 2012.
EnteliWEB Overview, web pages retrieved on May 9, 2013 from http://deltacontrols.com/products/facilities-management/supervisory-software et seq. by the Internet Archive at web.archive.org.
"BACnet Protocol Implementation Conformance Statement" for enteliWEB, Delta Controls, Jul. 17, 2013.
Castle, "7 Software Platforms that Make Building Energy Management Easy," http://greentechadvocates.com/2012/11/28/7-software-platforms-that-make-building-energy-managment-easy/, Nov. 28, 2012.
EnteliWEB "Software: Enterprise Energy Management", catalog sheet, Delta Controls, 2012.
EnteliWEB "Software: Enterprise Energy Management", catalog sheet, Delta Controls., 2010.
"Intelligent Building Management Systems in Miami," Advanced Control Corp., Mar. 7, 2013.
"The Ohio State University," BACnet International Journal, vol. 5, p. 4, Jan. 2013.
Bobker et al., "Operational Effectiveness in Use of BAS," Proceedings of the 13th International Conference for Enhanced Building Operations, Oct. 8, 2013.
Castelo, "A 3D Interactive Environment for Automated Building Control," Elsevier, Nov. 8, 2012.
"Creston Special Report: How Intelligent building management solutions are reducing operational costs," Creston, 2012.
"Building Automation Software Solutions," Iconics, 2013.
Lacey, "The Top 10 Software Vendors Connecting Smart Buildings to the Smart Grid," http://www.greentechmedia.com/articles/read/the-top-10-companies-in-enterprise-smart-grid, Jul. 18, 2013.
"NiagraAX Product Model Overview," Tridium, Inc., 2005.
"An Overview of NiagraAX: A comprehensive software platform designed to create smart device applications," Tridium, Inc., 2005.
"Phoenix Controls Portal," Phoenix Controls, Inc., 2013.
Quirk, "A Brief History of BIM," Arch Daily, Dec. 7, 2012.
Samad et al., "Leveraging the Web: A Universal Framework for Building Automation," Proceedings of the 2007 American Control Conference, Jul. 11, 2007.
Sinha et al., "9 Key attributes of energy dashboards and analytics tools," Aug. 28, 2013, https://www.greenbiz.com/blog/2013/08/28/9-key-attributes-energy-dashboards-and=analytics-tools.
Sinopoli, "Dashboards For Buildings," http://www/automatedbuildings.com/news/dec10/articles/sinopoli/101119034404sinopoli.html, Dec. 2010.
Sinopoli, "Modeling Building Automation and Control Systems," http://www.automatedbuildings.com/news/jun13/articles/sinopoli/130521122303sinopoli.html, Jun. 2013.
Zito, "What is Tridium Part 1," http://blog.buildingautomationmonthly.com/what-is-tridium/, May 12, 2013.
Zito, "What is Tridium Part 2," http://blog.buildingautomationmonthly.com/tridium-part-2/, Sep. 10, 2013.
International Search Report and Written Opinion dated Jul. 17, 2018 for International PCT Application No. PCT/US2018/025189 (12 pages).
"Data analytics and smart buildings increase comfort and energy efficiency", https://www.microsoft.com/itshowcase/Article/Content/845/Data-analytics-and-smart-buildings-increase-comfort-and-energy-efficiency, Dec. 19, 2016, 8 pages.
Donnelly, "Building Energy Management: Using Data as a Tool", http://www.buildingefficiencyinitiative.org/sites/default/files/legacy/InstituteBE/media/Library/Resources/Existing-Building-Retrofits/Using-Building-Data-as-a-Tool.pdf, Oct. 2012, 9 pages.
"ASHRAE Dashboard Research Project," 29 pages, Aug. 28, 2008.
Honeywell, "Energy Manager User Guide," Release 3.2, 180 pages, 2008.
"Fuzzy Logic Toolbox 2.1, Design and Stimulate Fuzzy Logic Systems," The MathWorks, 2 pages, May 2004.
"Junk Charts, Recycling Chartjunk as junk art," 3 pages, Oct. 2, 2006.
"Model Predictive Control Toolbox 2, Develop Internal Model-Based Controllers for Constrained Multivariable Processes," The MathWorks, 4 pages, Mar. 2005.
Honeywell, "Product Guide 2004," XP-002472407, 127 pages, 2004.
"Statistics Toolbox, for Use with Matlab," User's Guide Version2, The MathWorks, 408 pages, Jan. 1999.

(56) References Cited

OTHER PUBLICATIONS

"Vykon Energy Suite Student Guide," Tridium Inc., 307 pages, Mar. 3, 2006.
"Web Based Energy Information Systems for Energy Management and Demand Response in Commercial Buildings," California Energy Commission, 80 pages, Oct. 2003.
Andover Controls, Network News, vol. 2, No. 2, 8 pages, 1997.
Andover Controls World, 4 pages, Spring 1997.
Bell et al., "Early Event Detection—Results from A Prototype Implementation," AICHE Spring National Meeting, 15 pages, Apr. 2005.
Cadgraphics, "The Cadgraphics User's Guide, " 198 pages, 2003.
Carrier Comfort Network CCN Web, "Web Browser User Interface to the Carrier Comfort Network," 2 pages, 2002.
Carrier Comfort Network CCN Web, Overview and Configuration Manual, 134 pages, Apr. 2006.
Carrier Comfort Network CCN Web, Product Data, 2 pages, Apr. 2006.
Carrier, "i-Vu Powerful and Intuitive Front End for Building Control," 2 pages, Aug. 2005.
Carrier, "i-Vu Web-Based Integrated Control System," 3 pages, 2005.
Carrier, Demo Screen Shots, 15 pages, prior to Aug. 27, 2007.
Carrier, i-Vu CCN 4.0, Owner's Guide, 20 pages, Jul. 2007.
Carrier, i-Vu CCN, 7 pages, 2007.
Chan, "Rank Revealing QR Factorizations," Linear Algebra and It's Applications, vol. 88-89, p. 67-82, Apr. 1987.
Circon, "i-Browse Web-Based Monitoring and Control for Facility Management," 2 pages, prior to Aug. 27, 2007.
Australian Application 2009904740, Published copy, 28 pages, Application Filed on Sep. 29, 2009.
Echelon, "Energy Control Solutions with the i.Lon SmartServer," 4 pages, 2007.
Echelon, "i.Lon 100e3 Internet Server Models 72101R-300, 72101R-308, 72102R-300, 72103-R300 . . . " 5 pages, copyright 2002-2007.
Echelon, "i.Lon 100e3 Internet Server New Features," 15 pages, Sep. 2006.
Echelon, "i.Lon SmartServer," 5 pages, 2007.
Honeywell News Release, "Honeywell's New Sysnet Facilities Integration System for Boiler Plant and Combustion Safety Processes," 4 pages, Dec. 15, 1995.
Honeywell, "Excel Building Supervisor-Integrated R7044 and FS90 Ver. 2.0," Operator Manual, 70 pages, Apr. 1995.
Honeywell Home and Building Control Bulletin, "Introduction of the S7350A Honeywell WebPAD Information Appliance," 2 pages, Aug. 29, 2000; Picture of WebPad Device with touch screen, 1 Page; and screen shots of WebPad Device, 4 pages.
Honeywell, Excel 15B W7760B Building Manager Release 2.02.00, Installation Instructions, 28 pages, Dec. 2004.
Honeywell, The RapidZone Solution, Excel 5000 Open System, Application Guide, 52 pages, Jan. 2004.
"Remote Building Monitoring and Operations Home Page," 5 pages, prior to Aug. 27, 2007.
"Carrier: i-Vu CCN," 1 page, printed Mar. 11, 2008.
Carrier: 33CSCCNWEB-01 CCN Web Internet Connection to the Carrier Comfort Network, 1 page, printed Mar. 11, 2008.
"Products," 5 pages, printed Jul. 3, 2007. http://www.docs.hvacpartners.com/idc/groups/public/documents/techlit/gs-controls-ivuccn.rtf.
Lightstat Incorporated, "Internet Programmable Communicating Thermostats," 1 page, printed Mar. 13, 2007. http://www.lightstat.com/products/istat.asp.
Sharp, "Actius RD3D Desktop Replacement Notebook with Industry-Breakthrough 3D Screen," 1 page, printed Jun. 16, 2005. http://www.sharpsystems.com/products/pc_notebooks/actius/rd/3d/.
"Lights On A Wireless Lighting Control System," 11 pages, printed Mar. 22, 2007 http://www2.sims.berkeley.edu/courses/is213/s06/projects/lightson;final.html.
I.Lon 100e3 Internet Server, 1 page, prior to Aug. 27, 2007.
I.Lon, SmartServer, 2 pages, prior to Aug. 27, 2007.
I-stat, Demo Screen Shots, 9 pages, printed Mar. 13, 2007.
I-stat, The Internet Programmable Thermostat, 2 pages, prior to Aug. 27, 2007.
Ball, "Green Goal of 'Carbon Neutrality' Hits Limit," TheWall Street Journal, 7 pages, Dec. 30, 2008.
Network Integration Engine (NIE), Johnson Controls, 3 pages, Nov. 9, 2007.
Network Integration Engine (NIE), Product Bulletin, Johnson Controls, pp. 1-11, Jan. 30, 2008.
Kourti, "Process Analysis and Abnormal Situation Detection: From Theory to Practice," IEEE Control Systems Magazine, p. 10-25, Oct. 2002.
Mathew, "Action-Oriented Benchmarking, Using CEUS Date to Identify and Prioritize Efficiency Opportunities in California Commercial Buildings," 26 pages, Jun. 2007.
Morrison et al., "The Early Event Detection Toolkit," Honeywell Process Solutions, 14 pages, Jan. 2006.
Narang, "Webarc: Control and Monitoring of Building Systems Over the Web," 53 pages, May 1999.
Extended European Search Report, European Patent Office, EP Application No. 23176172.7, Oct. 31, 2023 (10 pgs).

\* cited by examiner

LOW POWER SENSOR WITH ENERGY HARVESTING

TECHNICAL FIELD

The present disclosure pertains generally to sensors and more particularly to low power sensors with energy harvesting.

BACKGROUND

Building control systems often employ a number of sensors. HVAC (Heating, Ventilating and Air Conditioning) systems employ a number of sensors including temperature sensors, humidity sensors, AIQ (indoor air quality) sensors, and the like. Building management systems include a number of occupancy or motion sensors. Security systems can employ a large number of sensors, including but not limited to door open sensors, window open sensors, PIR (passive infrared) and other motion sensors, glass break detectors, and the like.

A facility may have a large number of sensors distributed throughout the facility, and hard wiring all of these sensors for power can be cost-prohibitive, not to mention that hard wiring the sensors means that the sensors are more difficult to move around the facility. In some cases, the optimal location for each of the sensors may not be known initially. In some cases, how frequently a particular sensor should report a sensor value may not be known initially. What would be beneficial are low power sensors that are able to power themselves, such as via energy harvesting, and in some cases, learn over time and adjust their own operation accordingly.

SUMMARY

This disclosure relates generally to sensors and more particularly to low power sensors with energy harvesting. An example may be found in a sensor assembly for use in a building management system of a facility. The illustrative sensor assembly includes a housing, a sensor that is configured to sense one or more sensed parameters, and a transmitter that is configured to communicate over a wireless protocol. A power supply is disposed relative to the housing and is configured to power the sensor assembly. A power reserve parameter is tracked that is representative of a remaining power stored by the power supply. A light harvesting element is disposed relative to the housing. The light harvesting element is configured to convert incident light into electrical energy for replenishing the power stored by the power supply. A controller is disposed within the housing and operably coupled with the sensor and the power supply. In this example, the controller is configured to activate and deactivate the sensor in accordance with a first activation schedule, wherein the sensor consumes more power from the power supply when the sensor is activated than when the sensor is deactivated. The controller is configured to monitor the power reserve parameter of the power supply, and when the power reserve parameter drops below a first power reserve threshold, the controller is configured to alter the activation schedule to a second activation schedule for the sensor that reduced power consumption from the power supply. After the light harvesting element replenishes the power stored by the power supply above a second power reserve threshold, the controller is configured to alter the activation schedule to return to the first activation schedule for the sensor.

Another example may be found in a system for interfacing with a sensor assembly with a power supply that is replenished with a light harvesting element. The illustrative system includes a receiver for receiving information from the sensor assembly, a transmitter for transmitting information to the sensor assembly, and a controller that is operatively coupled to the receiver and the transmitter. The controller is configured to receive via the receiver one or more sensed parameters sensed by a sensor of the sensor assembly and to receive via the receiver a power reserve parameter that is representative of a remaining power stored by the power supply of the sensor assembly. The controller is configured to transmit via the transmitter an activation schedule to the sensor assembly, wherein the activation schedule controls when the sensor assembly activates the sensor of the sensor assembly to sense one or more sensed parameters, wherein the activation schedule is based at least in part on the power reserve parameter received from the sensor assembly. Alternatively, or in addition, the activation schedule may control when the sensor assembly transmits one or more sensed parameters and/or the power reserve parameter to the receiver of the system. In some cases, the controller is configured to control one or more components of the system (such as a BMS system) based at least in part on one or more of the sensed parameters.

Another example may be found in a sensor assembly. The illustrative sensor assembly includes a housing, a sensor configured to sense one or more parameters near the sensor assembly, a radio frequency (RF) transmitter, and an NFC (near field communication) receiver. A power supply is disposed relative to the housing and is configured to power the sensor assembly. A power reserve parameter is generated that is representative of a remaining power stored by the power supply. A light harvesting element is disposed relative to the housing, where the light harvesting element is configured to convert incident light into electrical energy for replenishing the power supply. A controller is disposed within the housing and is operably coupled with the sensor, the power supply, the RF transmitter and the NCF receiver. The controller is configured to allow the power supply to accept electrical power provided to the NFC receiver by a remote device, and to power the controller, the sensor and the RF transmitter using the electrical power accepted via the NFC receiver in order to allow configuration and testing of the sensor assembly when the power supply does not have sufficient stored power to power the sensor assembly. This may allow the sensor assembly to be setup, configured and even operationally tested as part of a building control system even when the power supply of the sensor assembly does not have sufficient stored power to power the sensor assembly.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
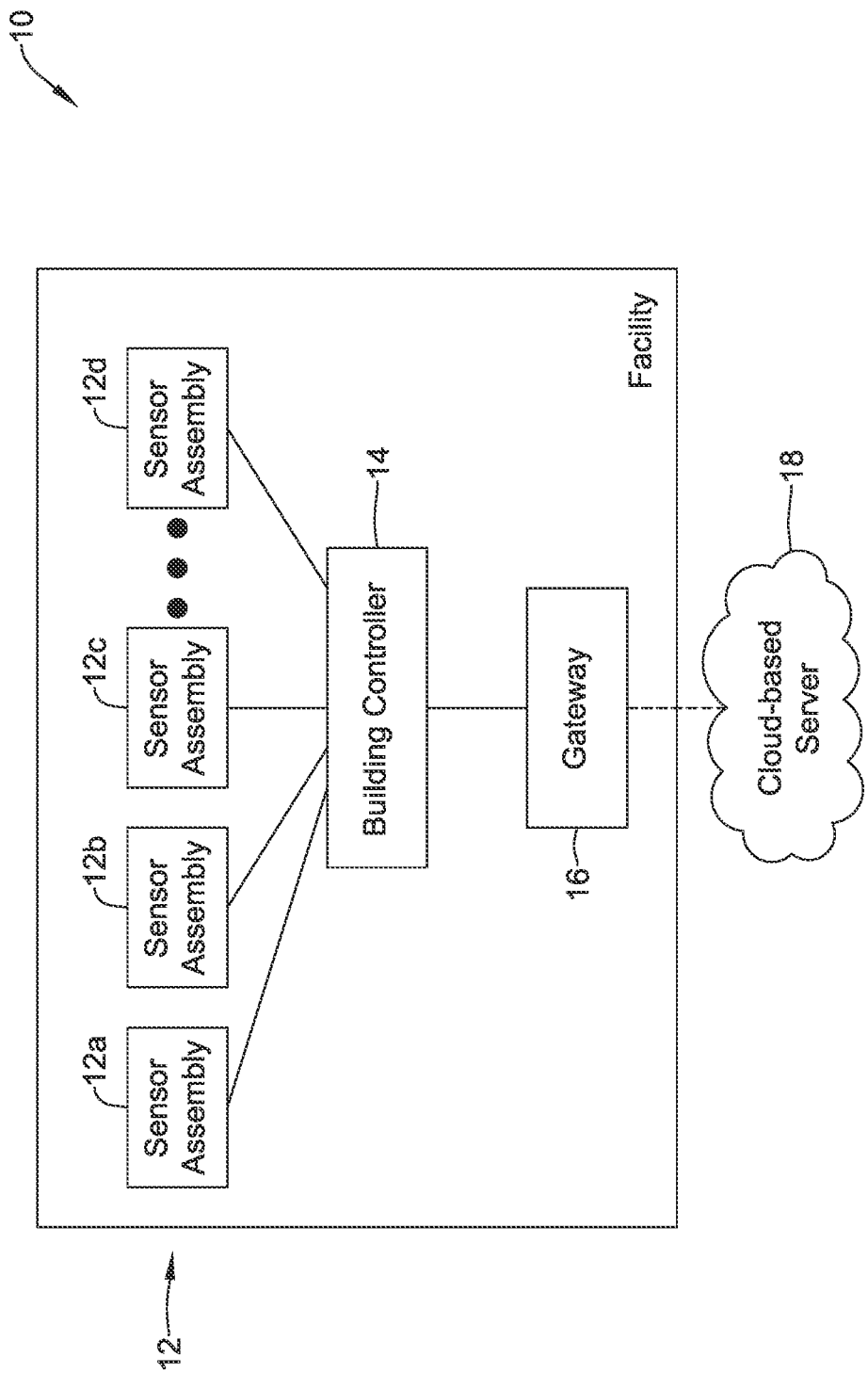
FIG. 1 is a schematic block diagram showing an illustrative building management system.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram of an illustrative building management system 10. The illustrative building management system 10 may, for example, represent any of a variety of different building management systems. As an example, the building management system 10 may represent at least part of an HVAC system. The building management system 10 may represent a security system. The building management system 10 may represent a facility access system, for example. The building management system 10 may control the lighting within a facility. In some cases, the building management system 10 may provide real-time location services (RTLS).

The illustrative building management system 10 includes a number of sensor assemblies 12, individually labeled as 12a, 12b, 12c and through 12n. The building management system 10 may include any number of sensor assemblies 12, and may include hundreds or even thousands of sensor assemblies 12. When the building management system 10 includes an HVAC system, the sensor assemblies 12 may include temperature sensors, humidity sensors, AIQ sensors, occupancy sensors, IR sensors, light sensors (Lux level), power supply status sensors (used to generate a power reserve parameter) and the like. When the building management system 10 includes a security system, the sensor assemblies 12 may include door open sensors, window open sensors, PIR and other types of motion sensors, glass break detection sensors, IR sensors, light sensors (Lux level), power supply status sensors (used to generate a power reserve parameter) and the like. In some cases, some of the sensor assemblies 12 may be part of a first building management system and some of the sensor assemblies 12 may be part of a second building management system that is different from the first building management system.

The sensor assemblies 12 are operably coupled with a building controller 14. In some instances, the sensor assemblies 12 may be operably coupled with a building network (not shown), with each of the sensor assemblies 12 and the building controller 14 both located on the building network, and able to communicate therebetween using the building network. In some cases, the building network includes an IT (information technology) network. In some cases, the building network includes an OT (operational technology) network. In some instances, the building network may merge an IT network and an OT network. The building network may be a wired network, for example, or a wireless network. In some cases, each of the sensor assemblies 12 may communicate directly with the building controller 14 using any desired wireless communication protocol. The sensor assemblies 12 may report sensor values and a power reserve parameter back to the building controller 14. In some cases, the building controller 14 may issue or pass along commands to at least some of the sensor assemblies 12, such as instructing one or more of the sensor assemblies 12 to turn on and take a reading, for example. The building controller 14 may instruct one or more of the sensor assemblies 12 to alter a schedule upon which the particular sensor assembly 12 takes sensors readings, or perhaps altering a communication schedule by which the particular sensor assembly 12 reports sensor readings back to the building controller 14.

In some cases, the building controller 14 may exert local control over the building management system 10, with all data processing and decision making occurring within the building management system 10. In some cases, the building controller 14 may be operably coupled, such as by the aforementioned building network, with an edge gateway 16. In some cases, the edge gateway 16 may perform at least some of the data processing and decision making occurring within the building management system 10. In some instances, the edge gateway 16 provides data from the building management system 10 to a cloud-based server 18. At least some of the data processing and decision making may occur within the cloud-based server 18, and the results and/or instructions for the building management system 10 may be passed back down to the building management system 10 through the edge gateway 16.

In some cases, the building management system 10 may include a sensing service that is configured to receive a sensor data feed in order to learn the typical behavior of a building, thereby providing a robust sensing solution in all situations. For example, in case a sensor device is in an energy saving mode because the power reserve parameter is low, sensor values may be transmitted less frequently. In this case, the building Artificial Intelligence (AI) and sensing services may leverage past knowledge to predict the "lost"

sensing values, thereby helping to maintain continuity of the sensing services and intelligence. The sensing service may be implemented within one or more of the sensor assemblies 12, building controller 14, gateway 16 and/or cloud-based server 18.

Figure 2:
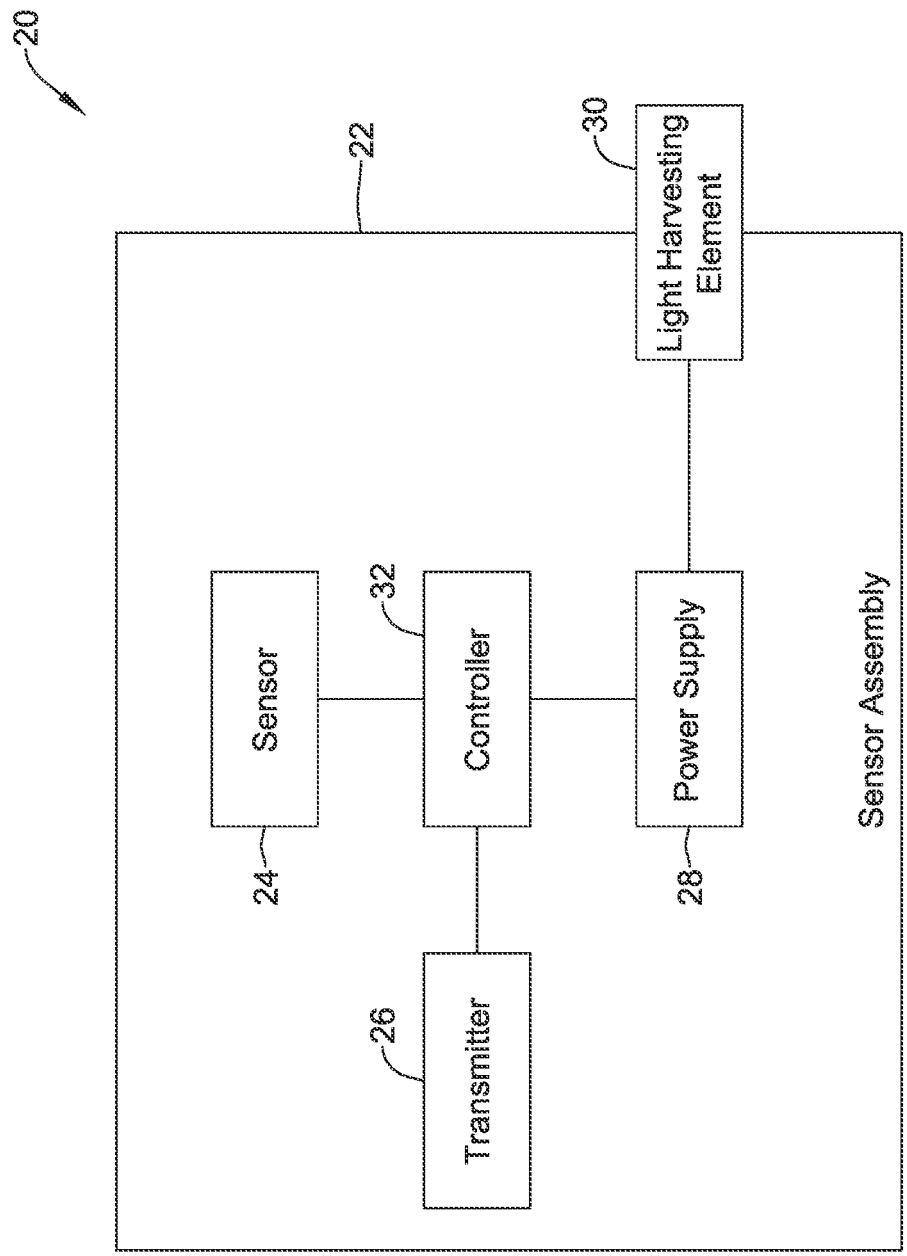
FIG. 2 is a schematic block diagram of an illustrative sensor assembly usable in the illustrative building management system of FIG. 1.

FIG. 2 is a schematic block diagram showing an illustrative sensor assembly 20 that may be used within the building management system 10. The illustrative sensor assembly 20 may be considered as being an example of one of the sensor assemblies 12. The sensor assembly 20 includes a housing 22. In some cases, the housing 22 may be configured to be secured relative to a vertical surface such as a wall. The housing 22 may be configured to be secured relative to the vertical surface using one or more nails, screws or other fasteners. In some cases, the housing 22 may be configured to be secured relative to the vertical surface using an adhesive, such as an adhesive pad. A protective liner may be removed from the adhesive pad, and the adhesive pad may be secured to the vertical surface, thereby securing the housing 22 in place. In some cases, the housing 22 may include one or more standoffs that space the housing 22 from the vertical surface, and provide a thermal break and thus increased thermal isolation between the housing 22 and the vertical surface. The one or more standoffs may be made from a material with a low thermal conductivity (such as plastic) and may have a relatively small cross-section to reduce thermal conduction from the vertical service to the housing 22. As an example, the one or more standoffs may be made from Polyethylene Terephthalate, High-Density Polyethylene, Polyvinyl Chloride, Low-Density Polyethylene, Polypropylene, Polystyrene, Polymethyl Methacrylate, Polycarbonate, or Acrylonitrile-Butadiene-Styrene. In some cases, the total cross section of all of the one or more standoffs may be less than 0.5 $cm^2$, less than 1 $cm^2$, or less than 2 $cm^2$. In some cases, and when an adhesive is used to adhere the sensor assembly 20 to the vertical service, the one or more standoffs may terminate at a foot feature that has an enlarged cross-section relative to the standoffs. The adhesive is applied to the foot feature and adheres the foot feature to the vertical surface. This is just one example.

The illustrative sensor assembly 20 includes a sensor 24 that is configured to sense one or more sensed parameters. If the sensor 24 is a temperature sensor, the sensor may be configured to sense temperature. If the sensor 24 is a humidity sensor, the sensor may be configured to sense humidity. In some cases, the sensor 24 may be configured to sense multiple sensed parameters. As an example, the sensor 24 may be configured to sense both temperature and humidity, or perhaps two or more different AIQ parameters such as $CO_2$ concentration, VOC (volatile organic compounds) concentration and PM2.5 concentration. These are just examples.

The illustrative sensor assembly 20 includes a transmitter 26 that is configured to communicate over a wireless protocol. This may allow the sensor assembly 20 to communicate with the building controller 14, for example, in order to share sensors values with the building controller 14. The sensor assembly 20 may also include a receiver to receive scheduling updates from the building controller 14. The transmitter 26 may be configured to operate over any desired wireless protocol, such as but not limited to WiFi, Bluetooth, BLE (Bluetooth Low Energy) and/or any other suitable wireless protocol.

The illustrative sensor assembly 20 includes a power supply 28 that is disposed relative to the housing 22. In some cases, the power supply 28 is disposed within the housing 22. The power supply 28 is configured to power the sensor assembly 20. The power supply 28 may be a rechargeable battery. In some cases, the power supply 28 may be a capacitor or a series of capacitors. In some cases, the power supply 28 may report its charge status from which a power reserve parameter may be determined. The power reserve parameter may be representative of a remaining power stored by the power supply 28. A light harvesting element 30 is disposed relative to the housing 22, and may be exposed to an exterior of the housing 22 such that incident light is able to reach the light harvesting element 30. The light harvesting element 30 is configured to convert incident light into electrical energy for replenishing the power stored by the power supply 28. In some cases, the light harvesting element 30 may be a photovoltaic cell.

The illustrative sensor assembly 20 includes a controller 32 that is disposed within the housing 22 and is operably coupled with the sensor 24 and the power supply 28. The controller 32 is configured to activate and deactivate the sensor 24 in accordance with a first activation schedule, wherein the sensor 24 consumes more power from the power supply 28 when the sensor 24 is activated than when the sensor 24 is deactivated. In some cases, the sensor 24 may be turned on when activated, and may be turned off when deactivated. In some cases, the sensor 24 may assume a higher power sensing state when activated, and may assume a lower power sleep state when deactivated. In one example, the controller 32 is configured to monitor the power reserve parameter of the power supply 28, and when the power reserve parameter drops below a first power reserve threshold, the controller 32 is configured to alter the activation schedule to a second activation schedule for the sensor 24 that reduces power consumption from the power supply 28. In some cases, the second activation schedule includes deactivating the sensor 24 for at least a majority of the time between when the power reserve parameter drops below the first power reserve threshold and when the light harvesting element 30 replenishes the power stored by the power supply 28 above a second power reserve threshold. In some cases, the first and/or the second activation schedule may be based at least in part on one or more past sensed parameters. In some cases, the first and/or second activation schedule may be based at least in part on an AI (artificial intelligence) model that is trained using one or more past sensed parameters.

In some cases, after the light harvesting element 30 replenishes the power stored by the power supply 28 above a second power reserve threshold, the controller 32 is configured to alter the activation schedule to return to the first activation schedule for the sensor 24. In some cases, the second power reserve threshold may be the same as the first power reserve threshold, or may be higher than the first power reserve threshold. By having the second power reserve threshold higher than the first power reserve threshold, a hysteresis is introduced which may help prevent the sensor 24 from rapidly switching between the first and second activation schedules when the power reserve parameter dithers around the first power reserve threshold.

In some cases, the controller 32 may be configured to transmit via the transmitter 26 first information that is based at least in part on one or more of the sensed parameters, and when the power reserve parameter drops below a third power reserve threshold, the controller 32 may be configured to transmit second information that is based at least in part on one or more of the sensed parameters, wherein transmitting the second information consumes less power from the power supply 28 than transmitting the first information. The second information may be transmitted less often than the first information. In some cases, the second information includes less information than the first information. The third power reserve threshold may be the same as the first power reserve threshold, although in some cases the third power reserve threshold may be higher or lower than the first power reserve threshold.

Figure 3:
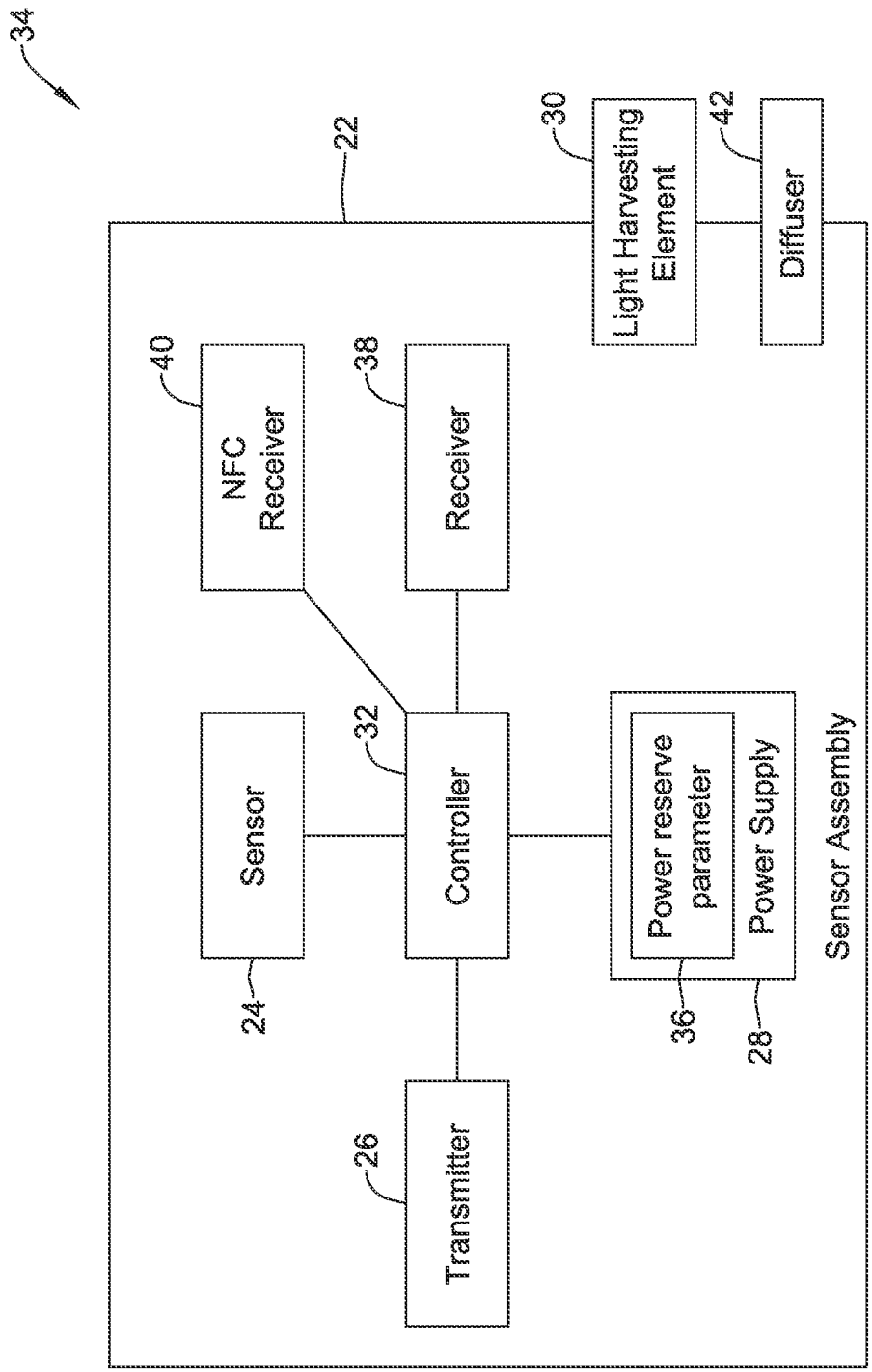
FIG. 3 is a schematic block diagram of an illustrative sensor assembly usable in the illustrative building management system of FIG. 1.

FIG. 3 is a schematic block diagram of an illustrative sensor assembly 34 that may be used within the building management system 10. The illustrative sensor assembly 34 may be considered as being an example of one of the sensor assemblies 12. The sensor assembly 34 is similar to the sensor assembly 20, and includes many of the same components. The sensor assembly 34 also includes several additional components. The power supply 28 expressly shows a power reserve parameter 36 that provides an indication of power remaining within the power supply 28. The power reserve parameter may be represented by a voltage, a current, a resistance and/or other electrical parameter, or may be determined from one or more electrical parameter. For example, as the remaining power of the power supply 28 drops, the voltage and/or current produced by the power supply 28 may also drop. In this example, the voltage produced by the power supply 28 may provide an indication of power remaining within the power supply 28, and may be representative of the power reserve parameter 36.

In some cases, the sensor assembly 34 includes a transmitter 26 and a receiver 38 for communicating over a wireless protocol. The transmitter 26 may allow the sensor assembly 20 to communicate with the building controller 14, for example, in order to share sensors values with the building controller 14. The receiver 38 may receive information from the building controller 14, such as scheduling updates. In some cases, at least part of the second activation schedule is received over the wireless protocol by the receiver 38. The transmitter 26 and receiver 38 may be configured to operate over any desired wireless protocol, such as but not limited to WiFi, Bluetooth, BLE (Bluetooth Low Energy) and/or any other suitable wireless protocol.

In some cases, the sensor assembly 34 may include an NFC (near field communication) receiver 40 that is operably coupled with the controller 32. NFC is based on inductive coupling between two so-called antennas present on NFC-enabled devices. In some cases, the controller 32 is configured to accept electrical power that is received inductively by the NFC receiver 40 and to power the controller 32, the sensor 24 and the transmitter 26 using the electrical power accepted via the NFC receiver 40 in order to setup, configure and even operationally test the sensor assembly 34 as part of a building management system 10 (including testing operational communication over the wireless network) even when the power supply 28 of the sensor assembly 34 does not have sufficient stored power to power the sensor assembly 34. In some cases, the power accepted by the NFC receiver 40 may be provided by an NFC transmitter of a nearby device, such as but not limited to a smartphone or the like. It is also contemplated that the NFC receiver 40 may receive information from an NFC transmitter of a nearby device such as a smartphone via NFC communication. Such information may include, for example, setup and configuration information. In some cases, NFC may be used to wake up the controller 32 and the sensor 24, among other components, from a "zero-power standby", thereby avoiding a need for any extra switch-on buttons when the sensor assembly 34 is initially shipped and installed for the first time. The setup and/or configuration information may include, for example, security keys and/or passwords for establishing a wireless connection with a building controller such as building controller 14. The setup and/or configuration information may include a default sampling period for the sensor 24, units of measure for use in reporting the sensed value, default first and/or second power reserve thresholds, default first and/or second activation schedules, the geo-location of the sensor 24, device information for the sensor 24 (e.g. sensor type, model, serial number, MAC address, etc.) and/or other information. In some cases, the setup and/or configuration information may include a control algorithm for use by the controller 32 when controlling the sensor assembly 34. In some cases, the control algorithm may include an AI model.

The illustrative sensor assembly 34 may include a light diffuser 42. In some cases, the light diffuser 42 may form a front portion of the housing 22, and may be configured to at least partially obstruct a view of the light harvesting element 30 while still permitting some incident light to pass through the light diffuser 42 and strike the light harvesting element 30. In some cases, the sensor assembly 34 may use one of a variety of different light diffusers 42. A particular light diffuser 42 may obstruct the view of the light diffuser 42 but may not allow as much incident light to pass through. Another light diffuser 42 may allow more incident light to pass through, but may allow the light harvesting element 30 to be at least partially visible.

A particular light diffuser 42 may be selected based on how the sensor assembly 34 will be used. If the sensor assembly 34 will be located within an office space that is busy and well-lit, the light diffuser 42 may be selected to have a better appearance, with the possible tradeoff of less power generation. However, if the sensor assembly 34 will be located within a basement that is not heavily trafficked, and is frequently dark, the light diffuser 42 may be selected to allow for more light transmission, and thus greater power generation, at the expense of perhaps not being as attractive.

Figure 4:
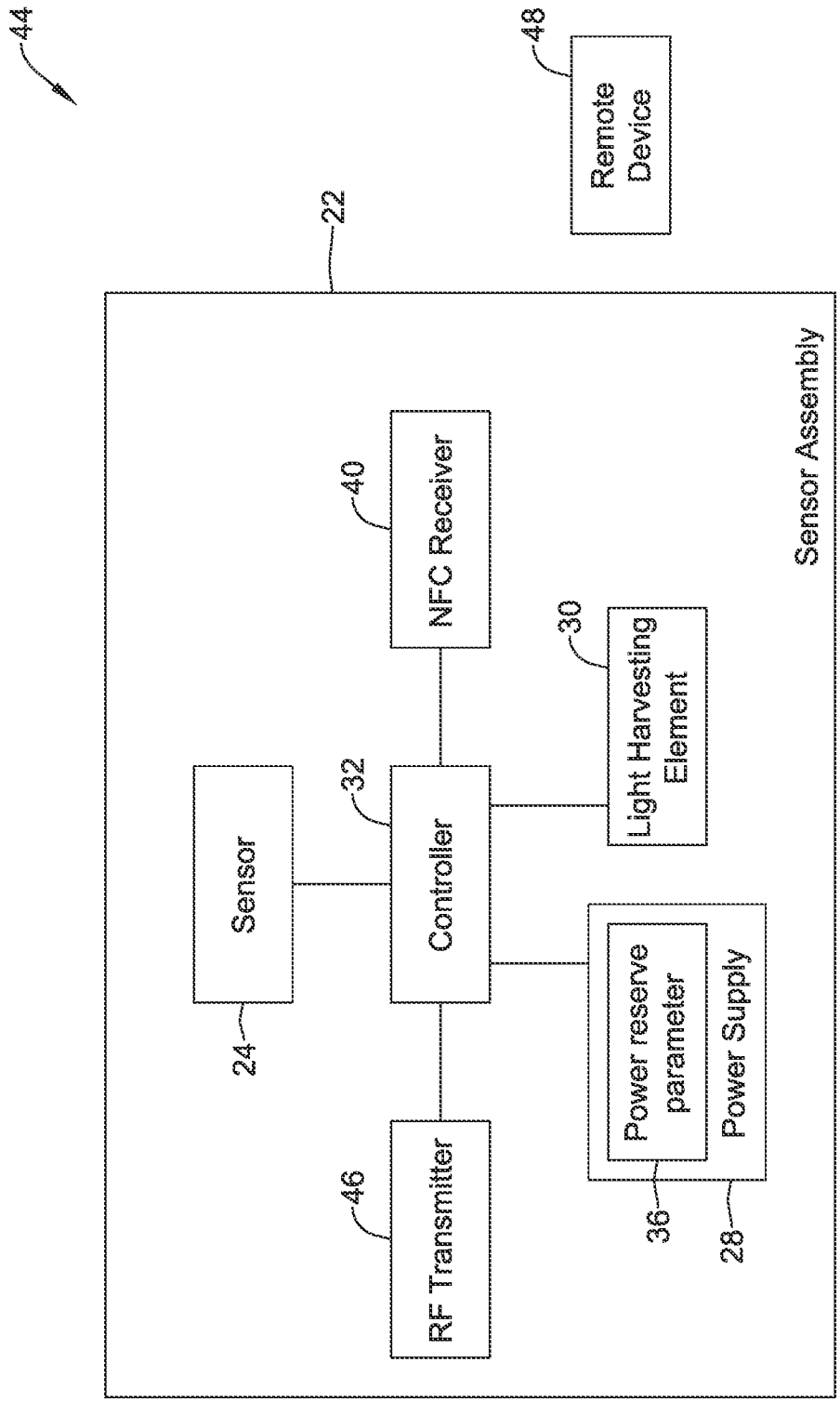
FIG. 4 is a schematic block diagram of an illustrative sensor assembly usable in the illustrative building management system of FIG. 1.

FIG. 4 is a schematic block diagram of an illustrative sensor assembly 44 that may be used within the building management system 10. The illustrative sensor assembly 44 may be considered as being an example of one of the sensor assemblies 12. The sensor assembly 44 is similar to the sensor assembly 20 and the sensor assembly 34, and includes many of the same components. The sensor assembly 44 also includes several additional components. For example, the sensor assembly 44 includes an RF (radio frequency) transmitter 46, instead of a more general transmitter 26. The RF transmitter 46 allows the sensor assembly 44 to communicate with the building controller 14 using RF communication, for example.

A remote device 48, which may for example be a smartphone, may function as a source of NFC energy and/or NFC communication. The controller 32 may be configured to allow the power supply 28 to inductively accept electrical power provided to the NFC receiver 40 by the remote device 48, and to power the controller 32, the sensor 24 and the RF transmitter 46 using the electrical power accepted via the NFC receiver 40 in order to allow an installer to setup, configure and even operationally test the sensor assembly 34 as part of a building management system 10 even when the power supply 28 of the sensor assembly 44 does not have sufficient stored power to power the sensor assembly 44. In some cases, the controller 32 may be further configured to accept security keys/passwords via the NFC receiver 40, and to use the security keys/passwords to establish communication with the remote device 48 via the RF transmitter 46.

Figure 5:
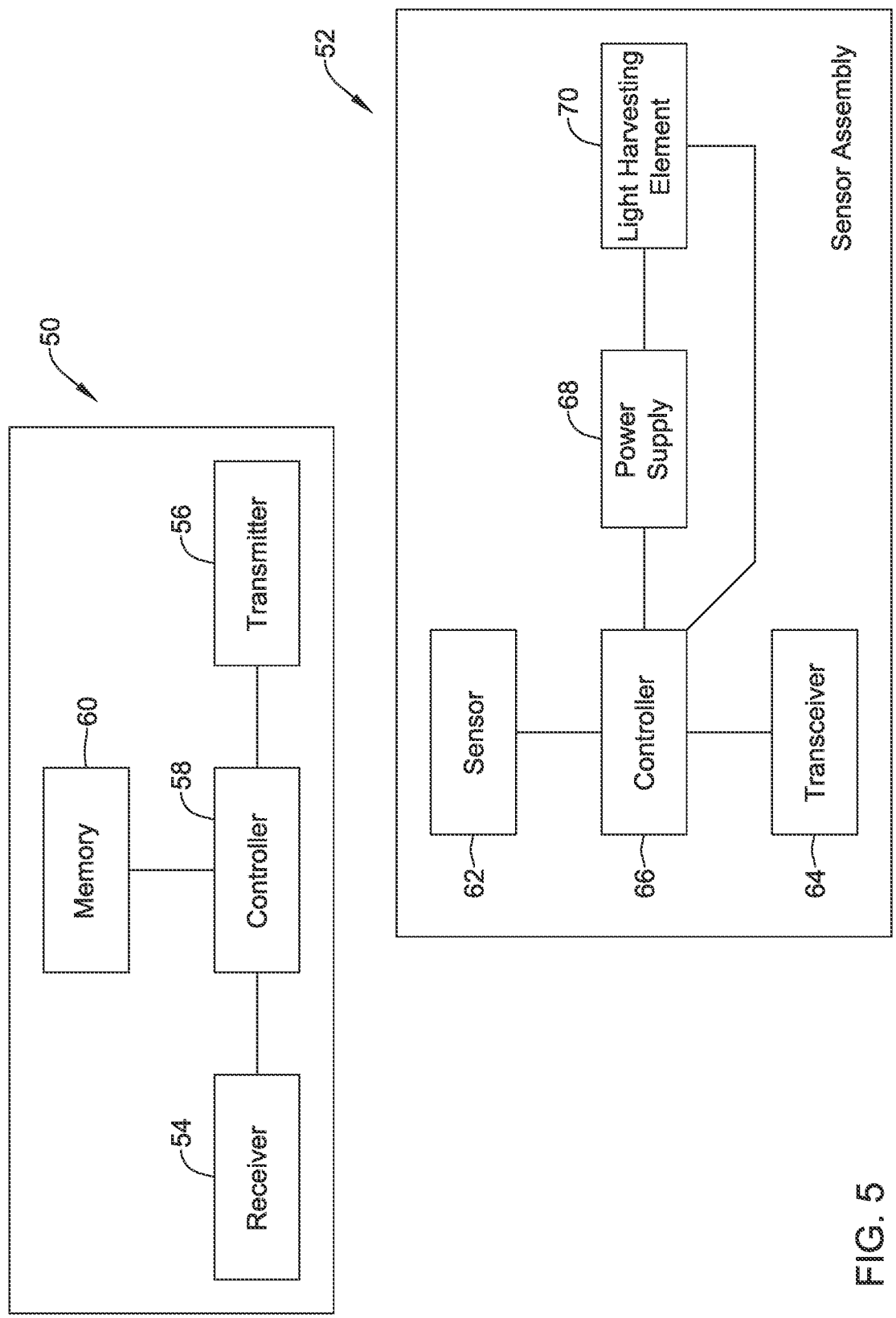
FIG. 5 is a schematic block diagram of an illustrative system usable in combination with a sensor assembly.

FIG. 5 is a schematic block diagram of an illustrative system 50 usable in combination with a sensor assembly 52.

In some cases, the sensor assembly 52 may be considered as being an example of the sensor assembly 12, the sensor assembly 20, the sensor assembly 34 or the sensor assembly 44. Features attributed to any of the sensor assembly 12, the sensor assembly 20, the sensor assembly 34 or the sensor assembly 44 may be applicable to the sensor assembly 52. The system 50 includes a receiver 54 that is configured to receive information from the sensor assembly 52. The system 50 includes a transmitter 56 that is configured to transmit information to the sensor assembly 52. A controller 58 is operably coupled to the receiver 54 and to the transmitter 56.

The sensor assembly 52 includes a sensor 62 and a transceiver 64 that may be configured to both receive and transmit information with the system 50. In some cases, the sensor assembly 52 may instead include a receiver and a separate transmitter. The illustrative sensor assembly 52 includes a controller 66 that is operably coupled to the sensor 62 and to the transceiver 64. The sensor assembly includes a power supply 68 which is recharged via energy provided by a light harvesting element 70.

With respect to the system 50, the controller 58 is configured to receive via the receiver 54 one or more sensed parameters sensed by the sensor 62 of the sensor assembly 52 and to receive via the receiver 54 a power reserve parameter that is representative of a remaining power stored by the power supply 68 of the sensor assembly 52. The controller 58 is configured to transmit via the transmitter 56 an activation schedule to the sensor assembly 52, wherein the activation schedule controls when the sensor assembly 52 activates the sensor 62 of the sensor assembly 52 to sense one or more sensed parameters, wherein the activation schedule is based at least in part on the power reserve parameter received from the sensor assembly 52. The activation schedule may simply be an updated sampling period for the sensor 62, or may be a more elaborate activation schedule that is based on, for example, time of day, day of week, day or year, etc. In some cases, the activation schedule may be based at least in part on one or more past sensed parameters of the sensor 62. In some cases, the activation schedule may be based at least in part on an AI (artificial intelligence) model that is trained using one or more past sensed parameters of the sensor 62.

The controller 58 of the system 50 is configured to control one or more components (not shown) of the system 50 based at least in part on one or more of the sensed parameters. As an example, the system 50 may be a BMS (building management system) for a facility, and the one or more components may include one or more building management components of the facility (e.g. HVAC, Security, Lighting components). In some cases, the system 50 may further include a memory 60 for storing occupancy hours for the facility. The activation schedule may be based at least in part on the stored occupancy hours for the facility.

In some cases, the controller 58 may be configured to monitor one or more of the sensed parameters over time and to predict one or more future sensed parameters using one or more previous sensed parameters, sometimes using artificial intelligence. The controller 58 may be configured to economize the activation schedule (e.g. reduce the power consumed by the sensor assembly 52 when executing the activation schedule) by reducing a number of times the sensor assembly 52 activates the sensor 62 of the sensor assembly 52. In some cases, this may be accomplished by using one or more predicted future sensed parameters rather than scheduling a sensor activation of the sensor 62.

In some cases, the controller 66 and/or the controller 58 may be configured to monitor an amount of electrical power being generated by the light harvesting element 70. When the amount of electrical power being generated by the light harvesting element falls below a power generation threshold, the controller 66 and/or controller 58 may be configured to recognize that ambient light conditions proximate the sensor assembly 52 are low, and may adjust the activation schedule to conserve electrical power of the power supply 68 of the sensor assembly 52. As an example, the amount of electrical power being generated by the light harvesting element may fall below the power generation threshold as a result of the lights being turned off proximate the sensor assembly 52. Having the lights off can be an indication that the corresponding space is unoccupied. As such, when the sensor assembly 52 includes a motion sensor, the motion sensor may be deactivated until the light harvesting element indicated the lights proximate the sensor assembly 52 are turned back on. Likewise, when the sensor assembly 52 includes a temperature sensor, the sample period of the temperature sensor may be increased, since accurate temperature control is not at critical in an unoccupied space, until the light harvesting element indicated the lights proximate the sensor assembly 52 are turned back on. These are just examples.

In some cases, the controller 66 and/or the controller 58 may store occupancy hours for the facility. The controller 66 and/or the controller 58 may modify the activation schedule based at least in part on the stored occupancy hours for the facility. For example, the controller 66 and/or the controller 58 may increase the sampling period for the sensor 62 during off hours of the facility to help conserve power of the power supply 68.

In some cases, the sensor assembly 52 may include a normal mode, an energy saving mode and a stay alive mode. The controller 66 may switch between these three modes based at least in part on the power reserve parameter of the power supply 68, the occupancy hours of the facility, the expected stability of the parameter sensed by the sensor 62, and/or any other suitable criteria. When in the normal mode, the controller 66 is configured to activate and deactivate the sensor assembly 52 in accordance with a normal activation schedule. When in the energy saving mode, the controller 66 is configured to activate and deactivate the sensor assembly 52 in accordance with an energy saving activation schedule. When in the stay alive mode, the controller 66 is configured to deactivate the sensor assembly 52 and periodically transmit maintenance alerts (e.g. Bluetooth maintenance alerts) via the transceiver 64.

In some cases, the system 50 may include a sensing service that is configured to receive a sensor data feed in order to learn the typical behavior of a building, thereby providing a robust sensing solution in all situations. For example, in case a sensor device is in an energy saving mode, sensor values may be transmitted less frequently, or in unprecedented scenarios such as a pandemic, which leaves buildings unoccupied for an extended period of time with the lights off, the sensor devices may switch to the stay alive mode sending very little data. In this case, the building AI and sensing services will leverage past knowledge to predict the "lost" sensing values thereby helping to maintain the continuity of the sensing services and intelligence. The sensing service may be implemented within the controller 58. In some instances, the sensing service may be implemented within a cloud-based server (e.g. cloud-based server 18) with which the system 50 is in communication.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A sensor assembly for use in a building management system of a facility, comprising:
   a housing;
   a sensor configured to sense one or more sensed parameters;
   a transmitter configured to communicate over a wireless protocol;
   a power supply disposed relative to the housing and configured to power the sensor assembly, the power supply having a power reserve parameter that is representative of a remaining power stored by the power supply;
   a light harvesting element disposed relative to the housing, the light harvesting element configured to convert incident light into electrical energy for replenishing the power stored by the power supply;
   a controller disposed within the housing and operably coupled with the sensor and the power supply, the controller configured to:
      repeatedly activate and deactivate the sensor in accordance with a first activation schedule defining a first sampling period for repeatedly activating the sensor, wherein the sensor consumes more power from the power supply when the sensor is activated than when the sensor is deactivated;
      monitor the power reserve parameter of the power supply;
      when the power reserve parameter drops below a first power reserve threshold, altering the activation schedule to a second activation schedule for the sensor that reduces power consumption from the power supply, the second activation schedule defining a second sampling period for repeatedly activating the sensor, wherein the second sampling period is longer than the first sampling period; and
      after the light harvesting element replenishes the power stored by the power supply above a second power reserve threshold, altering the activation schedule to return to the first activation schedule for the sensor.

2. The sensor assembly of claim 1, wherein the second power reserve threshold is above the first power reserve threshold.

3. The sensor assembly of claim 1, wherein the controller is further configured to:
   transmit via the transmitter first information that is based at least in part on one or more of the sensed parameters; and
   when the power reserve parameter drops below a third power reserve threshold, transmitting second information that is based at least in part on one or more of the sensed parameters, wherein transmitting the second information consumes less power from the power supply than transmitting the first information.

4. The sensor assembly of claim 3, wherein the third power reserve threshold is the same as the first power reserve threshold.

5. The sensor assembly of claim 3, wherein the second information is transmitted less often than the first information and/or includes less information than the first information.

6. The sensor assembly of claim 1, wherein the second activation schedule includes deactivating the sensor for at least a majority of the time between when the power reserve parameter drops below the first power reserve threshold and when the light harvesting element replenishes the power stored by the power supply above the second power reserve threshold.

7. The sensor assembly of claim 1, further comprising:
   a receiver for communicating over the wireless protocol; and
   the controller is configured to receive at least part of the second activation schedule from a receiver over the wireless protocol.

8. The sensor assembly of claim 1, wherein the second sampling period of the second activation schedule is based at least in part on one or more past sensed parameters.

9. The sensor assembly of claim 8, wherein the second sampling period of the second activation schedule is based at least in part on an Artificial Intelligence (AI) model that is trained using one or more past sensed parameters.

10. The sensor assembly of claim 1, further comprising a light diffuser disposed over the light harvesting element.

11. The sensor assembly of claim 1, further comprising a NFC (near field communication) receiver operably coupled with the controller, wherein the controller is configured to:
    accept electrical power received by the NFC receiver;
    power the controller, the sensor and the transmitter using the electrical power accepted via the NFC receiver; and
    receive via the NFC receiver and store one or more configuration settings for configuring at least part of the sensor assembly when the power supply does not have sufficient stored power to power the sensor assembly.

12. A system for interfacing with a sensor assembly with a power supply that is replenished with a light harvesting element, the system comprising:
    a receiver for receiving information from the sensor assembly;
    a transmitter for transmitting information to the sensor assembly;
    a controller operatively coupled to the receiver and the transmitter, the controller configured to:
       receive via the receiver one or more sensed parameters sensed by a sensor of the sensor assembly;
       receive via the receiver a power reserve parameter that is representative of a remaining power stored by the power supply of the sensor assembly;
       transmit via the transmitter an activation schedule to the sensor assembly, wherein the activation schedule predefines a plurality of subsequent activation times that control when the sensor assembly subsequently activates the sensor of the sensor assembly to sense one or more sensed parameters, wherein the plurality of subsequent activation times of the activation schedule are based at least in part on the power reserve parameter received from the sensor assembly; and
       controlling one or more components of the system based at least in part on one or more of the sensed parameters.

13. The system of claim 12, wherein the system is a Building Management System (BMS) for a facility and the one or more components include one or more building management components of the facility, the system further comprising:
    a memory for storing occupancy hours for the facility; and
    wherein the activation schedule is based at least in part on the stored occupancy hours for the facility.

14. The system of claim 12, wherein the controller is configured to:
monitor one or more of the sensed parameters over time;
predict one or more future sensed parameters using one or more previous sensed parameters using artificial intelligence; and
economize the activation schedule by reducing the plurality of subsequent activation times the sensor assembly activates the sensor of the sensor assembly by using one or more predicted future sensed parameters rather than scheduling a sensor activation of the sensor.

15. The system of claim 12, wherein the controller is configured to:
monitor an amount of electrical power being generated by the light harvesting element; and
when the amount of electrical power being generated by the light harvesting element falls below a power generation threshold, recognize that ambient light conditions proximate the sensor assembly are low and adjust the activation schedule to conserve electrical power of the power supply of the sensor assembly.

16. The system of claim 15, wherein adjusting the activation schedule to conserve electrical power of the power supply of the sensor assembly comprises increasing a time between two or more of the plurality of subsequent activation times of the activation schedule.

17. The system of claim 12, wherein the controller is configured to:
transmit via the transmitter a communication schedule to the sensor assembly, wherein the communication schedule controls when the sensor assembly transmits one or more sensed parameters sensed by a sensor of the sensor assembly to the receiver of the system, wherein the communication schedule is based at least in part on the power reserve parameter received from the sensor assembly.

18. The system of claim 12, further comprising a sensing service that is configured to:
monitor one or more of the sensed parameters over time; and
predict one or more future sensed parameters using one or more previous sensed parameters using artificial intelligence.

19. A sensor assembly, comprising:
a housing;
a sensor configured to sense one or more parameters near the sensor assembly;
a radio frequency (RF) transmitter;
an NFC (near field communication) receiver;
a power supply disposed relative to the housing and configured to power the sensor assembly, the power supply having a power reserve parameter that is representative of a remaining power stored by the power supply;
a light harvesting element disposed relative to the housing, the light harvesting element configured to convert incident light into electrical energy for replenishing the power supply;
a controller disposed within the housing and operably coupled with the sensor, the power supply, the RF transmitter, and the NFC receiver, the controller configured to:
accept electrical power provided to the NFC receiver by a remote device;
power the controller, the sensor and the RF transmitter using the electrical power accepted via the NFC receiver; and
receive via the NFC receiver and store one or more configuration settings for configuring at least part of the sensor assembly when the power supply does not have sufficient stored power to power the sensor assembly.

20. The sensor assembly of claim 19, wherein the one or more configuration settings comprises one or more security keys, and wherein the controller is configured to use the one or more security keys to establish communication to a remote device via the RF transmitter.

* * * * *